United States Patent
Pakdaman et al.

(10) Patent No.: US 6,859,031 B2
(45) Date of Patent: Feb. 22, 2005

(54) APPARATUS AND METHOD FOR DYNAMIC DIAGNOSTIC TESTING OF INTEGRATED CIRCUITS

(75) Inventors: Nader Pakdaman, Los Gatos, CA (US); Steven Kasapi, San Francisco, CA (US); Itzik Goldberger, Redwood City, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/229,181

(22) Filed: Aug. 26, 2002

(65) Prior Publication Data

US 2003/0146761 A1 Aug. 7, 2003

Related U.S. Application Data

(60) Provisional application No. 60/353,374, filed on Feb. 1, 2002.

(51) Int. Cl.$^7$ .............................................. G01N 27/72
(52) U.S. Cl. ...................................................... 324/233
(58) Field of Search ................................ 324/752, 233, 324/483

(56) References Cited

U.S. PATENT DOCUMENTS

| | | | |
|---|---|---|---|
| 4,681,449 A | | 7/1987 | Bloom et al. |
| 4,758,092 A | | 7/1988 | Heinrich et al. |
| 5,508,610 A | * | 4/1996 | Feeney ........................ 324/233 |
| 5,631,571 A | * | 5/1997 | Spaziani ...................... 324/752 |
| 5,640,539 A | | 6/1997 | Goishi et al. |
| 5,663,967 A | | 9/1997 | Prasad et al. |
| 5,721,688 A | * | 2/1998 | Barnwell ...................... 324/483 |
| 5,872,360 A | | 2/1999 | Paniccia et al. |
| 5,905,577 A | | 5/1999 | Wilsher et al. |
| 5,940,545 A | | 8/1999 | Kash et al. |
| 5,949,900 A | | 9/1999 | Nakamura et al. |
| 6,107,107 A | | 8/2000 | Bruce et al. |
| 6,184,696 B1 | | 2/2001 | White et al. |

FOREIGN PATENT DOCUMENTS

EP        0 652 444 A        5/1995

OTHER PUBLICATIONS

K. Soumyanath et al., "Accurate On–Chip Interconnect Evaluation: A Time–Domain Technique", IEEE Journal of Solid–State Circuits, vol. 34, No. 5, pp. 623–631, May 1999.
Hirotaka Komoda et al., "Optical Beam Induced Current Techniques for Failure Analysis of Very Large Scale Integrated Circuit Devices," Japanese Journal of Applied Physics, Tokyo, JP, vol. 33, No. 6A, Part 1, Jun. 1, 1994, (1994) pp3393–3401.

(List continued on next page.)

Primary Examiner—John F. Niebling
Assistant Examiner—Andre' C. Stevenson
(74) Attorney, Agent, or Firm—Pavel Pogodin, Esq.

(57) ABSTRACT

Systems and methods consistent with principles of the present invention allow contactless measuring of various kinds of electrical activity within an integrated circuit. The invention can be used for high-bandwidth, at speed testing of various devices on a wafer during the various stages of device processing, or on packaged parts at the end of the manufacturing cycle. Power is applied to the test circuit using conventional mechanical probes or other means, such as CW laser light applied to a photoreceiver provided on the test circuit. The electrical test signal is introduced into the test circuit by stimulating the circuit using a contactless method, such as by directing the output of one or more modelocked lasers onto high-speed receivers on the circuit, or by using a high-speed pulsed diode laser. The electrical activity within the circuit in response to the test signal is sensed by a receiver element, such as a time-resolved photon counting detector, a static emission camera system, or by an active laser probing system. The collected information is used for a variety of purposes, including manufacturing process monitoring, new process qualification, and model verification.

19 Claims, 8 Drawing Sheets

OTHER PUBLICATIONS

Manus et al., "Invited Picosecond Imaging Circuit Analysis of ULSI Microprocessors," 2002 IEEE MIT–S International Mocrowave Symposium Digest (IMS 2002), Seattle, WA Jun. 2–7, 2002, IEEE MTT–S International Microwave Symposium, New York, NY; IEEE, US, vol. 3 of 3. Jun. 2, 2002, pp. 1505–1508 ISBN: 0–7803–7239–5.

H. H. Berger et al., "Contactless Function Test of Integrated Circuits on the Wafer," Proceedings of the 22nd International Symposium for Testing and Failure Analysis, Nov. 18–22, 1996, Los Angeles, California, pp. 263–266.

F. Esfahani et al., "Small Area Optical Inputs for High Speed CMOS Circuits," Ninth Annual IEEE International ASIC Conference and Exhibit, Sep. 23–27, 1996, Rochester, New York, pp. 7–10.

H. Zimmerman & T. Heide, "A Monolithically Integrated 1–Gb/s Optical Receiver in 1–$\mu$m CMOS Technology," IEEE Photonics Technology Letters, vol. 13, No. 7, Jul. 2001, pp 711–713.

N. Khurana & C–L Chiang, "Analysis of Product Hot Electron Problems by Gated Emission Microscopy," International Reliability Physics Symposium, 1986, pp. 189–194.

F. Esfahani, "Testability Improvement of Highly Integrated Circuits by Optical Injection of Logical Levels into the Circuit," 1997, pp. 288–295.

P. Bellutti et al., "Fowler Nordheim Induced Light Emission from MOS Diodes," IEEE 2000 International Conference on Microelectronic Test Structures, pp. 223–226.

H. H. Berger et al., "Optical Signal Injection for High–Speed Wafer Level Function of Integrated Circuits," IEEE 1997 International Conference on Microelectronic Test Structures, vol. 10, Mar. 1997, pp. 39–42.

T. Ohzone et al., "A Study on Hot–Carrier–Induced Photoemmision in n–MOSFETs under Dynamic Operation," IEEE 2000 International Conference on Microelectronic Test Structures, pp. 75–80.

H. Zimmermann et al., "Monolithic High–Speed CMOS–Photoreceiver," IEEE Photonics Technology Letters, vol. 11, No. 2, Feb. 1999, pp. 254–256.

B. R. Hemenway et al., "Optical Detection of Charge Modulation in Silicon Integrated Circuits Using a Multimode Laser–Diode Probe," IEEE Electron Device Letters, vol. EDL–8, No. 8, Aug. 1987, pp. 344–346.

H. K. Heinrich et al, "Picosecond Backside Optical Detection of Internal Signals in Flip–Chip Mounted Silicon VLSI Circuits," Microelectronic Engineering, vol. 16, 1992, pp. 313–324.

H. K. Heinrich et al., "Backside Optical Measurements of Picosecond Internal Gate Delays in a Flip–Chip Packaged Silicon VLSI Circuit," IEEE Photonics Technology Letters, vol. 3, No. 7, Jul. 1991, pp. 673–675.

* cited by examiner

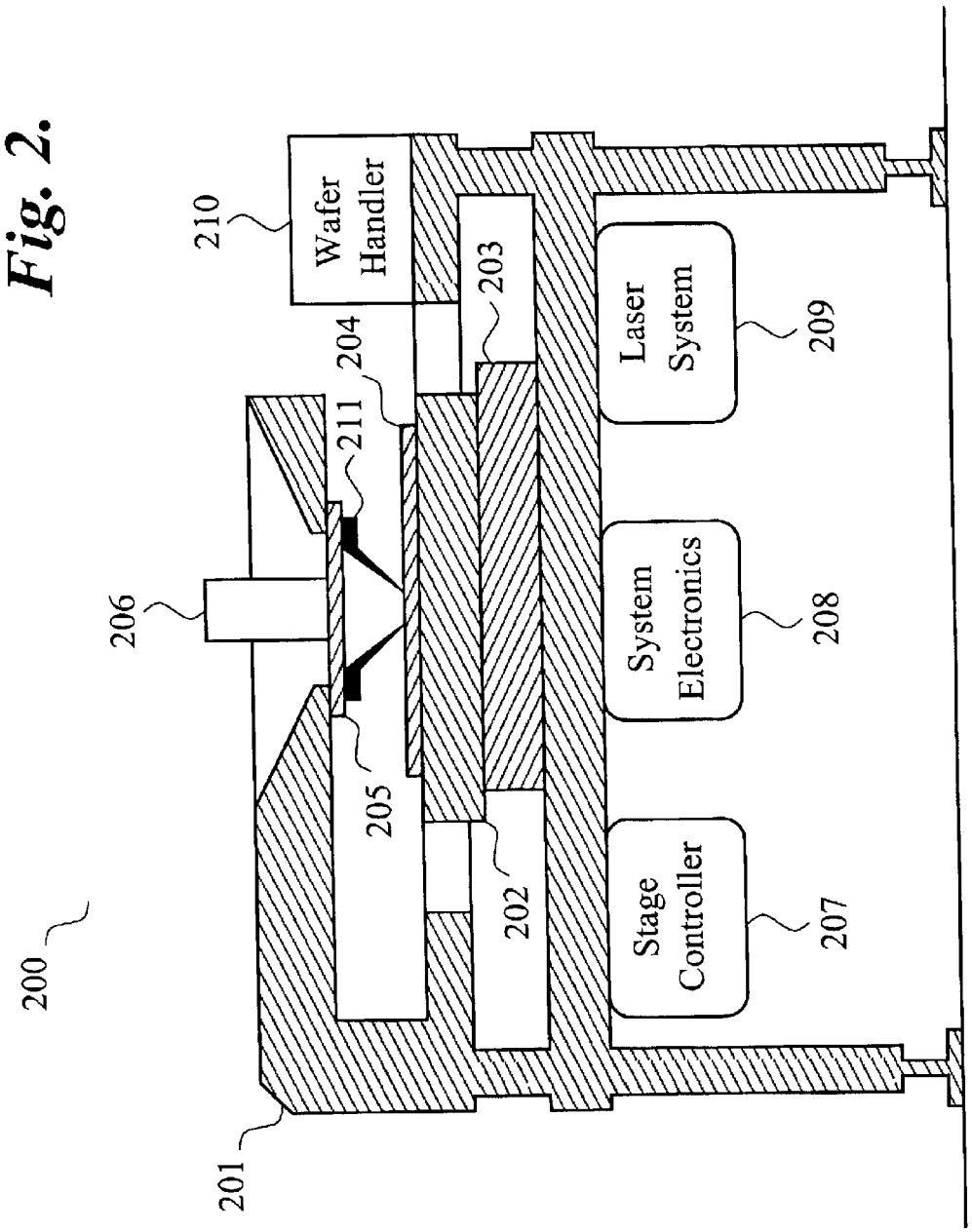

APPARATUS AND METHOD FOR DYNAMIC DIAGNOSTIC TESTING OF INTEGRATED CIRCUITS

CROSS-REFERENCE TO RELATED APPLICATION

This regular U.S. patent application is based on and claims the benefit of U.S. Provisional patent application Ser. No. 60/353,374, filed Feb. 1, 2002, the entire disclosure of which is relied upon and incorporated by reference herein.

DESCRIPTION OF THE INVENTION

1. Field of the Invention

The present invention generally relates to testing of integrated circuits, and more specifically to in-line high-bandwidth dynamic diagnostic testing of integrated circuits in the semiconductor device fabrication environment.

2. Description of the Related Art

Modern integrated circuits (ICs), such as high-performance microprocessor chips, are manufactured by creating pre-determined patterns of electronic components, such as logic gates, on a surface of a semiconductor wafer. The aforementioned electronic components are created on the wafer using a series of individual operations, or fabrication process steps. Such steps may include, but are not limited to, coating the surface of the wafer with photoresist, exposing the coated surface to the incident beam of light, performing chemical or plasma etching of the surface, deposition of material (i.e. metal or oxide), etc. The entire sequence of these steps, performed in a predetermined order, is called the semiconductor fabrication process, or simply process.

If, during the mass production of microelectronic devices, one or more process steps have been designed improperly or perhaps implemented incorrectly, the resulting integrated circuits may be faulty or may not perform to their expected performance specifications. As will be readily appreciated by those of skill in the art, it is be desirable to detect the fabrication process step failure or deviation from the process parameters as early as possible. Firstly, advanced integrated circuit fabrication and packaging processes are very costly. Therefore, it is desirable to continuously monitor the fabrication process in order to identify and remove from production the devices that are faulty or out of the pre-defined performance range before incurring additional costs by performing any subsequent fabrication and/or packaging steps on faulty devices. Secondly, it is imperative to identify and correct the faulty fabrication process step(s) or procedure(s) as soon as practical in order to prevent further deviation from specifications and production of non (or under) performing devices on the subsequent wafers. To this end, it is desirable to monitor continuously the vital performance characteristics (i.e. power draw or operating clock speed) of the manufactured devices.

Numerous electrical test methods have been developed to monitor the quality and integrity of the integrated circuit fabrication process. All such methods are based on predicting the performance of the completed integrated circuits, using the measurements obtained from partially processed wafers. According to one such method, the process robustness is monitored by using the results of certain parametric measurements to determine the key process-related parameters. For example, the thickness of the oxide film on the wafer can be determined through the resistivity measurements. In addition, the aforementioned parametric measurements can be used to determine specific critical device parameters that are directly tied into the fabrication process. For example, one could use the threshold voltage to determine the doping levels of the diffusions. These parametric measurements are performed at different stages on the partially processed wafer.

Parametric measurements are performed specifically to measure physical and electrical parameters related to the process, and do not directly determine circuit performance such as circuit speed. In other words, there is only an indirect relationship between the parametric measurements and the actual device performance. Exemplary parametric measurements include the measurements of transistor threshold voltage and off current leakage. During these measurements, electrical and process tests constant (DC) voltage or small-signal (AC) voltage is applied to predetermined locations on the wafer to activate the device structures at several discrete locations across the wafer. The integrity of the process is verified by comparing the values of the measured DC circuit parameters with a set of expected values.

However, as the geometry of the integrated circuits becomes smaller, the aforementioned parametric measurements as well as the traditional measurements of critical dimensions (also called geometrical circuit parameters) are becoming less effective at predicting and monitoring the final circuit performance behavior. This limitation of the existing techniques becomes especially significant for deep sub-micron geometry integrated circuits. The term deep sub-micron geometry circuits, used herein, describes circuits with characteristic linewidth dimensions of less than 0.25 microns. Specifically, the DC parametric measurements as well as the measurements of critical dimensions do not allow accurate prediction of at-speed (high frequency) parameters of such circuits. The correlation between device's performance (i.e. timing, speed, etc.) and the measured DC parameters, geometrical parameters or the physical process parameters is becoming even weaker for devices with even smaller line width dimensions, hereinafter referred to as sub-0.13 micron devices.

As integrated circuit manufacturers change their manufacturing processes to smaller linewidth dimensions, performance-related issues that could previously be ignored start to become significant. Process variability, inherent in large scale manufacturing of advanced products as well as monitoring thereof, further exacerbates the aforementioned weak correlation problem and makes it even more difficult to design and fabricate with high yield advanced products and perform the needed fabrication process characterization.

Finally, traditional mechanical probes used for to couple test signals into partially processed integrated circuits suffer from reliability problems caused by the probe needles scratching and damaging the contact pads as well as poor high frequency performance. Mechanical probes can also produce debris, which may result in contamination of the wafer. These traditional signal injection and measurement acquisition methods are not suitable for high-frequency, high-bandwidth, in-line production testing of integrated circuits required by the industry.

Accordingly, current diagnostic techniques (both metrological and electrical) are deficient in their ability to provide high-bandwidth contactless electrical measurements on an integrated circuit at the wafer level. Furthermore these traditional approaches are ineffective at providing critical performance information (such as speed, timing, and power consumption) that is the final determining factor in fabrication and design robustness.

SUMMARY OF THE INVENTION

The present invention is directed to methods and systems that substantially obviate one or more of the above and other problems associated with metrology and electrical test of advanced IC design and manufacturing. Consistent with exemplary embodiments of the present invention, there are provided methods for dynamic in-line diagnostics of integrated circuits.

According to an embodiment of the inventive method, a test signal is injected into the integrated circuit by electrically stimulating predetermined areas of the integrated circuit using a stimulating energy source. The stimulating energy source may provide the stimulating energy to the areas of the integrated circuit without a mechanical contact therewith. Subsequent electrical activity produced within the integrated circuit in response to the injected test signal is detected using a detector. Finally, the characteristics of the integrated circuit are determined based on the detected electrical activity.

According to a feature of the inventive method, the electrical activity in the integrated circuit may be detected in a manner that does not electrically "load" the circuit using a passive, non-invasive method.

According to another aspect of the invention, there is provided an apparatus for measuring electrical characteristics of an integrated circuit. The inventive apparatus may comprise a stimulating energy source for injecting a test signal into the integrated circuit by stimulating areas of the integrated circuit without mechanical contact of the stimulating energy source with the stimulated areas of the circuit. In addition, the inventive apparatus may also include a detector for detecting an electrical activity within the integrated circuit in response to the injected test signal. The detected electrical activity may be used to determined characteristics of the integrated circuit.

According to a feature of the inventive apparatus, the detector may operate to detect the electrical activity in the integrated circuit in an electrically non-loading or minimally-loading manner.

Additional aspects related to the invention will be set forth in part in the description which follows, and in part will be obvious from the description, or may be learned by practice of the invention. Aspects of the invention may be realized and attained by means of the elements and combinations particularly pointed out in the appended claims.

It is to be understood that both the foregoing and the following descriptions are exemplary and explanatory only and are not intended to limit the claimed invention in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

Figure 1:
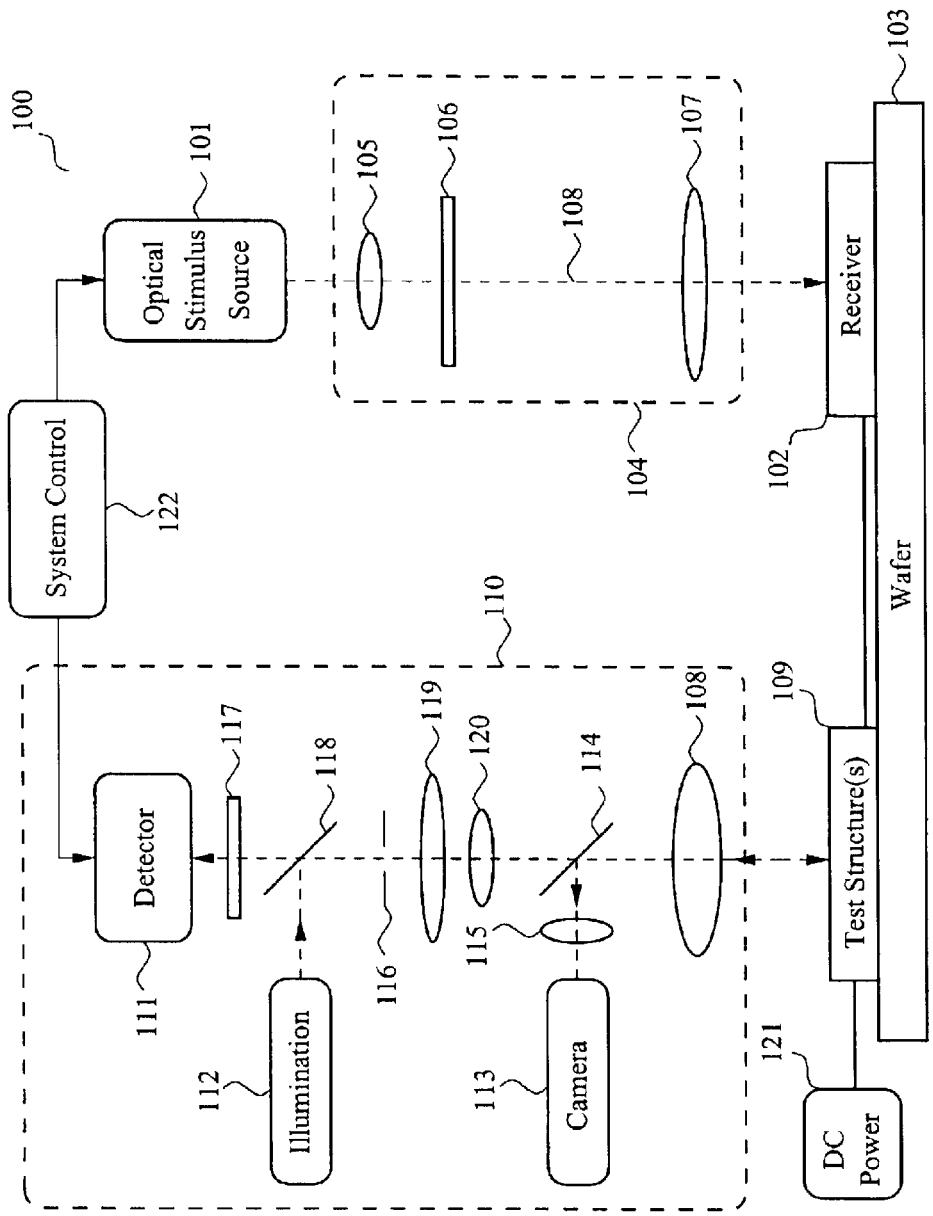
FIG. 1 illustrates an exemplary embodiment of a diagnostic system consistent with the principles of the present invention.

In the following detailed description, reference will be made to the accompanying drawings, in which identical functional elements are designated with like numerals. The aforementioned accompanying drawings show by way of illustration, and not by way of limitation, specific implementations consistent with principles of the present invention. These implementations are described in sufficient detail to enable those skilled in the art to practice the invention and it is to be understood that other implementations may be utilized and that structural changes may be made without departing from the scope and spirit of present invention. The following detailed description is, therefore, not to be construed in a limited sense.

Systems and methods consistent with principles of the present invention allow contactless high-bandwidth dynamic testing of integrated circuits on partially or completely processed wafers or packaged devices. Compared to the existing technology, the inventive diagnostic method has a potential for identification of a wider range of fabrication process failures during both the design and fabrication of the integrated circuit process as well as the control thereof. Specifically, the inventive technique provides means for direct measurement of high-speed, high-bandwidth dynamic characteristics of an integrated circuit at the wafer level. Some features of the inventive technique may include, but are not limited to: (1) the use of non-invasive, non-contact probing (except, possibly, for DC circuit power and ground); (2) the ability to perform measurements at early stages of the process (i.e. Metal Level 1 (M1) and Metal Level 2 (M2) layers); (3) the ability to perform early screening of process problems; (4) the ability to perform high-speed dynamic measurements; (5) the ability to perform gate-to-gate delay timing; (6) the ability to measure switching time of transistors; (7) the ability to measure temperature-dependent phenomena using a temperature-controlled wafer chuck; and (8) the ability to measure relative current in junction. In view of these and other features of the inventive technique, it will become apparent to persons of skill in the art that the inventive methodology may have applications in both the fabrication process development and the process monitoring. In addition, the inventive method is compatible with current semiconductor manufacturing methodologies.

According to an embodiment of the inventive diagnostic technique, predetermined areas of an integrated circuit under test are stimulated using a source of stimulating energy. The exact nature of this stimulating energy is not essential to the present invention. Specifically, the aforementioned stimulating energy source may be a source of electromagnetic radiation, such as a laser. Alternatively, the stimulating energy source may be a source of charged particles, such as an electron beam source or a mechanical probe. When applied to the circuit under test, the stimulating energy induces an electrical test signal within the circuit. To this end, the stimulating energy may be directed towards one or more "receivers" disposed within the proximity of the surface of the integrated circuit.

The aforementioned electrical test signal injected into the circuit under test by means of the stimulating energy source stimulates an electrical response within the circuit. In order to determine whether the circuit under test performs according to the appropriate design specifications, the aforementioned responsive electrical activity is detected and measured using an electrical activity detection apparatus. Finally, the characteristics of the circuit under test are determined based on the measured responsive electrical activity in the circuit. The integral components of the inventive diagnostic system will now be described in detail with reference to the attached drawings.

Reference will now be made to FIG. 1, which illustrates an exemplary embodiment of a diagnostic system 100 consistent with the principles of the present invention. The depicted embodiment of the diagnostic system 100 implementing the inventive measurement technique comprises an optical stimulus source 101 for stimulating one or more optical signal receivers 102 disposed on a wafer 103. The aforementioned optical stimulus source 101 is optically coupled with the corresponding signal receiver 102 by means of an optical coupling setup 104. The depicted embodiment of the optical coupling setup 104 may include a scan lens 105, a position adjustment means 106 and an objective lens 107. A beam of stimulating electromagnetic energy produced by the optical stimulus source 101 is designated in the FIG. 1 with numeral 108.

In the embodiment of the invention depicted in FIG. 1, the optical stimulus source 101 is an electromagnetic radiation source. Specifically, it may be a pulsed laser source, such as a modelocked laser or a Q-switched laser. In another embodiment, the stimulus source 101 may be a modulated continuous wave (CW) laser. The aforementioned Q-switched and modulated continuous wave (CW) lasers are well known to persons of skill in the art and are commercially available. Modelocked lasers, which can be externally synchronized, are also well known in the art and are commercially available from several vendors, including Time Bandwidth Products of Zurich, Switzerland and Lightwave Technologies, Inc. of California.

There are several methods for modulating a CW laser. For example, the CW laser light can be passed through an electro-optic modulator, which may comprise a set of crossed polarizers disposed at the input and output of the modulator. Between the aforementioned input and output polarizers, there is an electro-optic crystal which rotates the polarization of the input light by an amount which depends on an electric field applied to the crystal by two electrical plates which are disposed with respect to the crystal in a sandwich-like manner. The optical output of the modulator depends on the orientation of the input and output polarizers as well as the voltage applied to the electro-optic crystal. The described method for modulating a CW laser as well as other such methods are well known to those skilled the art. The appropriate equipment is available commercially from such vendors as New Focus, Inc. of California. In an embodiment of the inventive diagnostic system, the stimulus source 101 is externally synchronized to a timebase or a clock signal. In this embodiment, an external timebase generator, such as a crystal-based clock generator, may be provided for synchronizing the operation of various components of the system. In an alternative embodiment, the stimulus source 101 may provide the timebase for the rest of the system if it has its own timebase. Thereby, the optical stimulus signal 108 will be driven by a timebase shared by the rest of the diagnostic system 100.

In an embodiment of the invention, the stimulus signal 108 is detected by a photoreceiver 102 disposed on the wafer 103. Exemplary receivers suitable for application in the inventive system are described in detail in Zimmermann and Heide, A Monolithically Integrated 1-Gb/s Optical Receiver in 1 um CMOS Technology, IEEE Photonics Technology Letters, Vol. 13, No. 7, pp. 711–713, July 2001 and Zimmermann and Heide, A Monolithic High-Speed CMOS-Photoreceiver, IEEE Photonics Technology Letters, Vol. 11, No. 2, pp. 254–256, February 1999, incorporated herein by reference. Specifically, the photoreceiver 102 may be a CMOS-integrated p-i-n photodiode, which is characterized by high speed and high quantum efficiency. Such receivers may be manufactured by an industrial 1.0 micron CMOS process with a reduced doping concentration in the epitaxial layer. The aforementioned manufacturing process for CMOS-integrated p-i-n photodiode is well known to persons of skill in the art. It will also be understood by those of skill in the art, that the exact design of the receiver 102 is not essential to the present invention.

The receiver 102 may be manufactured using the same fabrication process technology as the one used in the fabrication of the circuit under test. It should be noted that because the wafer may be probed early in the manufacturing process, it is possible to couple the light to the receivers disposed on the front surface of the wafer. Accordingly, the optical stimulus source may operate using the light with wavelength of less than 1 micron, which is strongly absorbed by silicon. Other designs of the optical stimulus source 101 and the optical receiver 102 may be utilized. For example, an optical signal injection scheme utilizing a high-output Pigitailed laser diode source in conjunction with various types of photodiode receivers manufactured using the standard Thesys 1.5 micron n-well process is described in detail in H. H. Berger et al., Contactless Function Test of Integrated Circuits on the Wafer, Proceeding of the 22$^{nd}$ International Symposium for Testing and Failure Analysis, Nov. 18–22, 1996, Los Angeles, Calif., which is incorporated herein by reference. An article by F. Esfahani et al., Small Area Optical Inputs for High Speed CMOS Circuits, 9$^{th}$ Annual IEEE International ASIC Conference and Exhibit, Sep. 23–27 1996, Rochester, N.Y., incorporated herein by reference, demonstrates another technique for optically injecting a signal into an integrated circuit at a wafer or a package level using CMOS-type on-chip photodiodes sensitive in the visible light region. It should be noted, that one embodiment of the inventive technique may utilize light sources with shorter wavelength (<1 micron), where silicon absorbs more efficiently.

In an embodiment of the invention, the electrical test signal induced in the optical signal receiver 102 by the electromagnetic energy produced by the stimulus source 101 may be amplified, conditioned or buffered before being applied to the circuit under test 109. To this end, the integrated circuit disposed on the aforementioned wafer 103 may include optional signal amplification, buffering and conditioning circuitry (not shown in the FIG. 1). The methods for designing and implementing such circuitry are well known in the art. For example, an embodiment of a suitable signal conditioning circuit is described in the aforementioned article by H. H. Berger et al.

The electrical test signals injected into the circuit under test 109 induce a responsive electrical activity therein. To determine whether the circuit under test performs according to the appropriate design specifications, the need arises to detect and measure any such responsive electrical activity induced within the circuit by the aforementioned test signal. There have been developed numerous advanced techniques for detecting and quantitatively measuring various electrical signals within integrated circuits. Specifically, the responsive electrical activity may be measured by detecting photons emitted by various components of the integrated circuit. Methods for measuring electrical activity in the circuit based on the detected photon emission are well known in the art. Exemplary embodiments of aforementioned methods are described in Khurana, N. and C. L. Chiang, Analysis of Product Hot Electron Problems by Gated Emission Microscopy, in proceedings of International Reliability Physics Symposium (IRPS), 1986 and in U.S. Pat. No. 5,940,545, incorporated herein by reference in their entirety.

In the embodiment depicted in FIG. 1, the electrical activity induced in the circuit under test 109 by the electrical test signal is detected and measured using an electrical activity detection apparatus 110. An exemplary embodiment of the aforementioned electrical activity detection apparatus 110 comprises a hot-electron emission detector 111 for detecting photon emissions emanated by the circuit under test 109. The emission detector 111 of the electrical activity detection apparatus 110 needs to be capable of detecting extremely weak light emissions produced by the integrated circuit 109. For this purpose, the emission detector 111 may first amplify the input light emission signal to the amplitude suitable for detection by conventional means. For this purpose, the input stage of the emission detector 111 may be equipped with an appropriate light signal intensifier. Suitable signal intensifiers may include photon-counting detectors with time resolution, such as a photomultiplier tube (PMT) or an avalanche photon detector (APD) operating in the Geiger mode.

Photon detection techniques utilizing PMT and APD detectors are well known to those skilled in the art. Exemplary embodiments of these light detection devices are described in S. Charbonneau, L. B. Allard, J. F. Young, G. Dyck, B. J. Kyle, Rev. Sci. Instrum. 63, 5315 (1992). These devices are commercially available from numerous suppliers such as Quantar Technology, Inc. of Santa Cruz, Calif. An optical filter designated by numeral 117 in FIG. 1 is provided in order to prevent the optical signal produced by the stimulus source 101 from entering the detector 111. The filter 117 may be an optical interference filter. To facilitate filtering, in one embodiment of the invention, the frequency of the light signal produced by the optical stimulus source 101 is set to be different from the emission spectra of the integrated circuit. The transmission characteristics of the filer 117 may be chosen in such a manner as to enable it to block the light produced by the stimulus source 101, while being substantially transparent to the light emitted by the integrated circuit. For example, the wavelength of the stimulating laser could be 400 nm, which can be produced using a commercially available pulsed diode laser such as one manufactured by Polytec PI. On the other hand, the detected emission wavelength spectrum could be made between 1.0 micron and 1.5 micron using an InGaAs single-photon avalanche detector (SPAD).

Collection lens 108 facilitates the detection of the optical emissions and acquisition of the test structure images, while tube lens 120 controls the illumination of the test structures. A field lens 119 controls the width of the field of view of the detector 111 by generating an intermediate image of the upper surface of the test structure 109 in the plane of the field aperture 116. A system control module 122 controls overall operation of the apparatus by controlling the timing, image acquisition, positioning of the wafer, etc. The power is supplied to the circuit under test by a power supply module 121.

It will be appreciated by those of skill in the art that the emission detector 111 may be imaging as well as non-imaging. Specifically, an imaging emission detector 111 would provide information indicative of the spatial distribution of the intensity of the emitted photon signal across the surface area of the integrated circuit 109. Such imaging system may either have time resolution or collect the total incident photon flux rate over some period of time longer than typical events in the circuit (e.g. longer than 100 ps). An imaging system providing spatial information on the photon emission would allow the simultaneous collection of photons from emitting sources within the entire field of view of the optical system, thus potentially increasing system throughput and providing more comprehensive information on the circuit under test. One example of an imaging emission detector is a position-sensitive photon detector having no timing output, such as a cooled silicon charge-coupled device (CCD) detector or a cooled mercury-cadmium-telluride (MCT) detector. The design and methods of operation of the aforementioned charge-coupled device (CCD) detectors, mercury-cadmium-telluride (MCT) detectors as well as other suitable position-sensitive photon detectors are well known to persons of skill in the art. One example of an integrated circuit imaging system using a charge-coupled device (CCD) detector is described in detail in U.S. Pat. No. 5,940,545, incorporated herein by reference in its entirety.

On the other hand, a non-imaging emission detector 111 would provide information on the intensity and, possibly, the timing distribution of the emission signal, but not its spatial distribution. One example of a non-imaging emission detector is a non-position-sensitive photon detector, such as a photodiode or a photomultiplier tube.

In an embodiment of the inventive diagnostic technique, the emission detector 111 may be arranged to operate in a time-resolved manner. The term time-resolved emission detector, used herein, refers to an emission detector acquiring, among other information, the data on the timing characteristics of the detected signal. The aforementioned timing characteristics of the emission signal may include the time distribution of the intensity of the signal, or combined time and spatial distribution thereof.

One exemplary embodiment of the time-resolved emission detector is a gated emission detector, such as a microchannel plate (MCP) photomultiplier tube. Specifically, the gated emission detector is designed to collect the input emission signal only during a predetermined time interval, defined by a gate signal. The gating may be implemented, for example, by using the gate signal to control the high voltage power of the aforementioned microchannel plate (MCP) photomultiplier. The gate signal, which is supplied to the detector by an external logic, is positioned in time in a pre-determined relation with respect to the input test signal. By changing the relative time delay between the gate signal and the test signal, one could study the timing characteristics of the integrated circuit response to the input test signal. Accordingly, by varying the time delay between the pulse of the light source 101 and the gate signal supplied to the detector 111, the inventive diagnostic system may acquire information on the timing characteristics of the circuit under test.

Exemplary embodiments of the aforementioned non-imaging time-resolved detector include, but are not limited to, Indium-Gallium-Arsenide (InGaAs), Germanium (Ge) or Silicon (Si) single photon avalanche detectors (SPAD). Alternatively, a superconducting hot-electron bolometer could be also utilized for this purpose. The absorption of a photon by the non-imaging time-resolved emission detector produces a measurable voltage pulse which can be used to either start or stop the timing circuit. To this end, the stimulus optical source 101, providing the test signal, and the time-resolved emission detector 111, measuring the circuit's response to the test signal, may be synchronized using the same timebase.

An example of an imaging, time-resolved detector is an image intensifier (available from several vendors such as Hamamatsu Photonics of Hamamatsu, Japan) or photomultiplier tube with a resistive anode position readout (available from several vendors including Quantar Technologies of Santa Cruz, Calif. and Photek Ltd. of East Sussex, UK). Such imaging, time-resolved detectors provide both the time and the position of the detected photon, thus allowing simultaneous analysis of a region of the circuit under test (CUT).

The design and methods of operation of time-resolved photon detectors are well known to persons of skill in the art.

In another embodiment of the inventive diagnostic system, the emission detector 111 is a non-time resolved emission detector, such as the aforementioned cooled silicon charged-coupled device (CCD) and mercury-cadmium-telluride (MCT) detector arrays. The photon-sensitive detector without timing resolution may be used to perform either spatial emission measurement or the total photon emission measurements.

The detection and measurement of the responsive electrical activity in the integrated circuit may also be implemented using a laser-based waveform sampling system. An example of such system is described in U.S. Pat. No. 5,905,577, which is incorporated herein by reference. Specifically, the waveform of the electric signal in the circuit may be studied by focusing a laser beam onto the device under test (DUT) and detecting the reflected beam. The reflected beam carries information about the electrical signals in the DUT. This information may be encoded in the form of reflected beam amplitude, phase and/or polarization modulations. By analyzing the electrically induced modulated properties of the reflected laser beam, the system may determine the characteristics of the electric signals in the test circuit. To increase the signal-to-noise ratio of such a laser probing system, it is desirable to provide an additional reference laser beam and use the ratio of the amplitudes of the aforementioned two beams for the wave form analysis. Another example of a laser probing system is described in detail in U.S. Pat. No. 5,872,360, which is incorporated herein by reference. In the described system, a laser beam having a wavelength near the band gap of a semiconductor, such as silicon, is focused on a P-N junction. The application of the external electric field to the illuminated junction changes the degree of photo-absorption of the impinging laser light due to the phenomenon of electro-absorption. The disclosed system measures the characteristics of the laser light passing through the junction to reconstruct the properties of the electrical signal at the junction. It should be noted, that many other designs of laser sampling systems, well known to persons of skill in the art, may be utilized to analyze the responsive electrical activity within the circuit.

Additional designs of suitable laser-based probing systems are described in Hemenway, Heinrich et al., Optical Detection of Charge Modulation in Silicon Integrated Circuits Using a Multimode Laser-Diode Probe, IEEE Electron Device Letters, Vol. EDL-8, No. 8, August 1987; Heinrich, Pakdaman et al., Backside Optical Measurements of Picosecond Internal Gate Delays in a Flip-Chip Packaged Silicon VLSI Circuit, IEEE Photonics Technology Letters, Vol. 3, No. 7, July 1991; Heinrich, Pakdaman et al., Picosecond Backside Optical Detection of Internal Signals in Flip-Chip Mounted Silicon VLSI Circuits, Microelectronic Engineering, Vol 16, pp. 313–324, Elsevier 1992; and U.S. Pat. Nos. 4,758,092, 5,905,577, and 5,872,360. All the listed disclosures and patent documents are incorporated herein by reference in their entirety. It should be also noted that under some conditions the laser probing may not be suitable for small capacitance devices (such as ones fabricated using less than 0.13 micron technology) or silicon-on-insulator type devices because it can produce excessive leakage current if the laser is tuned near the band gap.

In another embodiment of the inventive technique, the electrical activity detection apparatus may be based on an electron beam probe. Specifically, the predetermined regions of the circuit under test may be illuminated using a beam of primary electrons. An electron detector may be provided in the vicinity of the wafer to register and measure any secondary emissions originating from the tested circuit. This emission information may be used to determine the responsive electrical activity within the circuit. In more detail, the emission of secondary electrons by a metal line exposed to the electron beam depends on the voltage applied to that line. Hence, the voltage on the line can be deterministically related to the secondary electron emission. By registering the secondary electron emission in a time resolved manner, the voltage on the line as a function of time can be partially reconstructed. Electron-beam probing technology is well-known to those skilled in the art and is described in L. C. Wagner, Ed., *Failure Analysis of Integrated Circuits: Tools and Techniques* (Kluwer Academic Publishers, 1999). However, because such a system may require sustaining of an ambient vacuum, it may be less suitable for application in some manufacturing processes.

It will be appreciated by those of skill in the art that the described embodiments of the electrical activity detection apparatus operate in electrically non-loading (or minimally-loading) and mechanically contactless manner. Specifically, the aforementioned means for detecting electrical activity in the integrated circuit based on the photon emission as well as the laser and electron-beam probing do not require a mechanical or capacitive coupling of the probe to the integrated circuit. Accordingly, the described methods of coupling of the electrical activity detection apparatus would not substantially alter the electrical loads or impedances within the circuit under test. Such mechanically contactless coupling and signal detection techniques that cause minimal or no electrical loading of the circuit will be referred to herein as electrically non-loading coupling and electrically non-loading signal detection.

Alternatively, the electrical activity in the circuit under test may be detected by means of a mechanical probe, mechanically engaging a conducting pad or a contact disposed on the surface of the integrated circuit in such a manner as to establish an electrical connection therewith. Such mechanical probe would be electrically connected to the input of an appropriate signal analysis circuit. As will be readily understood by those of skill in the art, such coupling may alter the circuit's impedance at the point of application of the mechanical probe.

In yet another embodiment, an electro-optic crystal can be disposed in the spatial proximity of a metal line on the wafer on which the voltage is to be measured. The application of a voltage to the metal line would cause the change of the electric field in the crystal. The aforementioned change in the electric field would, in turn, change the optical properties of the crystal. The optical properties of the crystal, indicative of the voltage on the metal line, can be probed by a suitable laser beam directed thereupon using a suitable optical system. This technique is described in detail in U.S. Pat. No. 4,681,449, which is incorporated herein by reference.

Finally, the electrical activity may be detected using a capacitive coupling of the probe and the test circuit. In more detail, a flat conductive probe may be arranged in a spatial proximity of a pad or a contact on the surface of the integrated circuit such as to provide for a capacitive coupling between the two without achieving a mechanical engagement thereof. To this effect, the flat surface of the probe may be aligned in substantially parallel manner with respect to the surface of the integrated circuit. As the mechanical probing method, this coupling technique may cause a change of the impedances and/or electrical loads in the integrated circuit, and, therefore, may have an affect on the circuit performance.

To aid in locating the appropriate test structure 109 on the wafer 103 during navigation, the surface of the wafer 103 may be illuminated using an illumination light source 112. The illuminating light generated by the light source 112 is directed towards the wafer 103 by mirror 118. For example, the illumination light source 112 may be implemented using a fiber-optic technology. In an embodiment of the inventive diagnostic system shown in FIG. 1, the image of the test structure 109, which is created in the aforementioned illuminating light reflected by the surface of the wafer 103, is registered by an array camera 113. To facilitate the acquisition of the image, the camera 113 is provided with a beam splitter 114 and a tube lens 115. The elements 118 and 114 may be removed away from axis of the optical system during the detection of the electrical activity in the circuit and re-inserted during the navigation. The image of the wafer created by camera 113 may be further processed using a variety of known image analysis or pattern recognition techniques, to locate the appropriate circuit on the wafer.

The injected test signal can either be directly coupled to the circuit under test (CUT), or it can be amplified, conditioned or buffered to increase the signal amplitude and edge sharpness. The test signal can be injected at one or more locations of the circuit using an appropriate optical beam-splitter and lens configuration. Alternately, more than one optical stimulus source can be used. The circuit under test can be either inter-die or intra-die. Inter-die circuits are typically spaced throughout the wafer. They can be used to monitor process and performance variations across the wafer. Intra-die circuits could be used to monitor variations of process and performance parameters within a die. Such variations may include, but are not limited to, variations in threshold voltage, leakage current, as well as variations in dynamic circuit behavior such as signal rise time.

The electrical test signals injected into the circuit under test induce a responsive electrical activity therein. To determine whether the circuit under test performs according to the appropriate design specifications, the need arises to detect and measure any such responsive electrical activity induced within the circuit by the aforementioned test signal. There have been developed numerous advanced techniques for detecting and quantitatively measuring various electrical signals within integrated circuits. Specifically, the responsive electrical activity may be measured by detecting photons emitted by various components of the integrated circuit under test.

Under normal operating conditions, a variety or sources within the integrated circuit may emit photons. The photon emission mechanisms include, but are not limited to: (1) emissions form gate oxide leakage between transistor gate and either the substrate or the diffusion area; (2) emissions from forward biased pn junctions; (3) emissions from MOS transistors in the state of saturation during normal switching operation; (4) emissions from MOS transistors in the state of saturation caused by an open circuit; (5) emissions from tunneling in a reverse-biased junction; and (6) emissions from electron-hole recombination.

By isolating and detecting emissions from specific localized sources within the integrated circuit, it may be possible to make conclusions about the behavior of the integrated circuit in response to the injected test signal. For example, an article by P. Bellutti et al., Fowler Nordheim Induced Light Emission From MOS Diodes, in proceedings of IEEE International Conference on Microelectron Test Structures, Monterey, Calif., Mar. 13–16 2000, incorporated herein by reference, describes a method for investigating integrated circuit behavior based on a photon emission from a gate leakage current, specifically the Fowler-Nordheim tunneling from the gate polysilicon through the oxide layer into the silicon. An embodiment of the present invention detects such emission using the time-resolved photon counting detector, described in detail above. Based on the detected photon emission, the value of the leakage current in the gate is calculated. In addition, the inventive diagnostic system may measure the dynamic emissions of MOSFET structures to study the timing, drain and substrate currents as well as other characteristics of integrated circuits, substantially as described in T. Ohzone, M. Yuzaki, T. Matsuda, et al., A Study on Hot-Carrier-Induced Photoemission in n-MOSFETs Under Dynamic Operation, in proceedings of IEEE International Conference on Microelectron Test Structures, Monterey, Calif., Mar. 13–16 2000, p. 75, incorporated herein by reference.

The regions of the circuit under test can be isolated either by using an imaging detector, or by providing an aperture 116 in the optical detection system 110 to block emission from other sites. The timing of the photon emission is detected by the emission detector 111 relative to the timing of the signal produced by the optical stimulus source 101, which is injected into the circuit. For this purpose, the system may include a time-to-amplitude converter (TAC) or other similar precision timing device. The photon emission data can be analyzed in a number of ways, including, but not limited to, one or more of the following: (1) edge-to-edge timing of transition events; (2) total photon emission; (3) photon emission in peaks; (3) shape of CUT emission compared to known good or simulated CUT emission; (5) spectral properties of the emission to look for sources of photon emission (which may require additional time for spectral measurements); and (6) strength of emission modulation, in the case wherein the stimulus source is used for device bias modulation. An exemplary embodiment of an integrated circuit testing system using a time-resolved emission detector is described in detail in the aforementioned U.S. Pat. No. 5,940,545.

Figure 2:
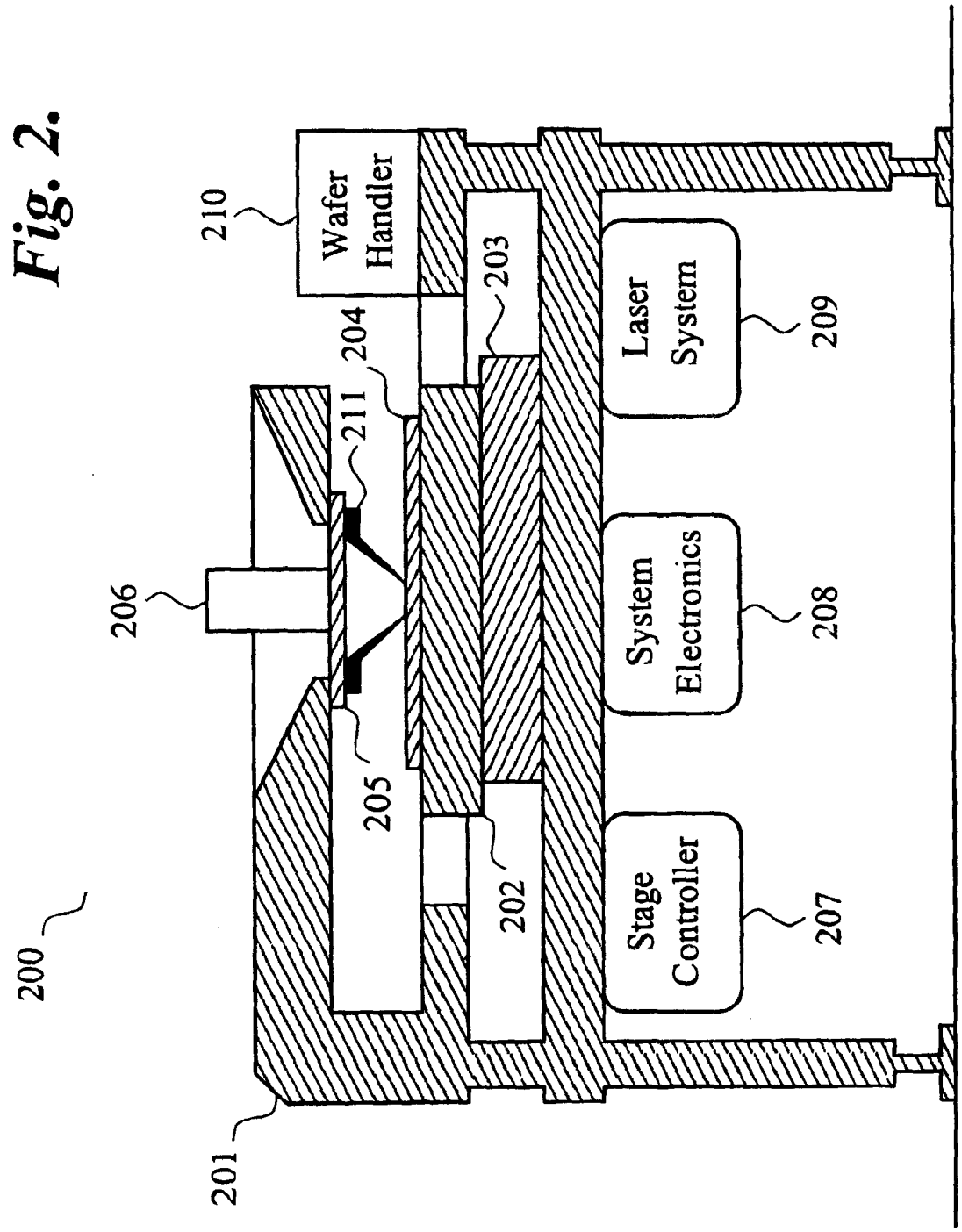
FIG. 2 depicts a layout diagram of an exemplary embodiment of a process monitoring system utilizing the inventive diagnostic technique.
Figure 3:
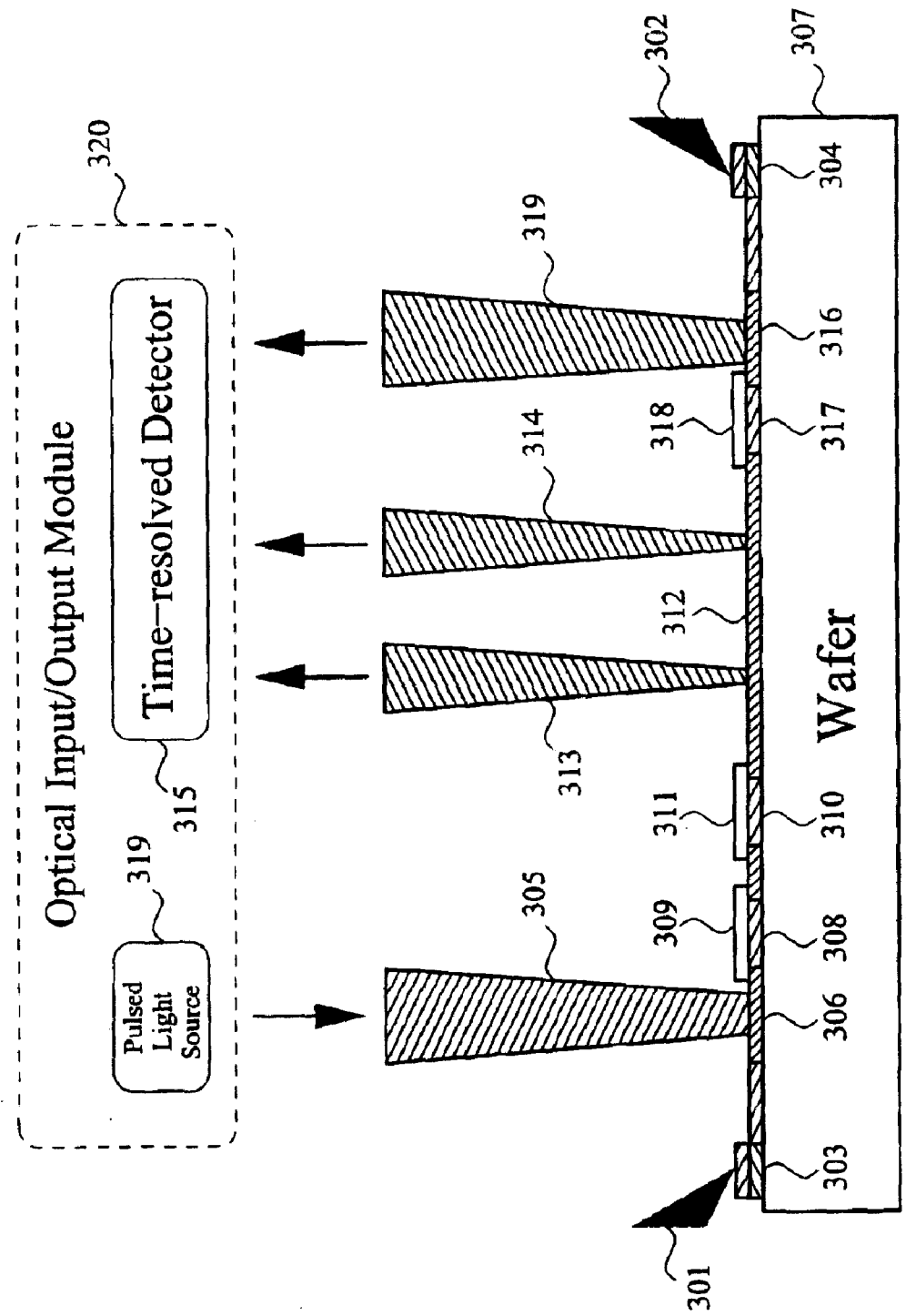
Figure 4:
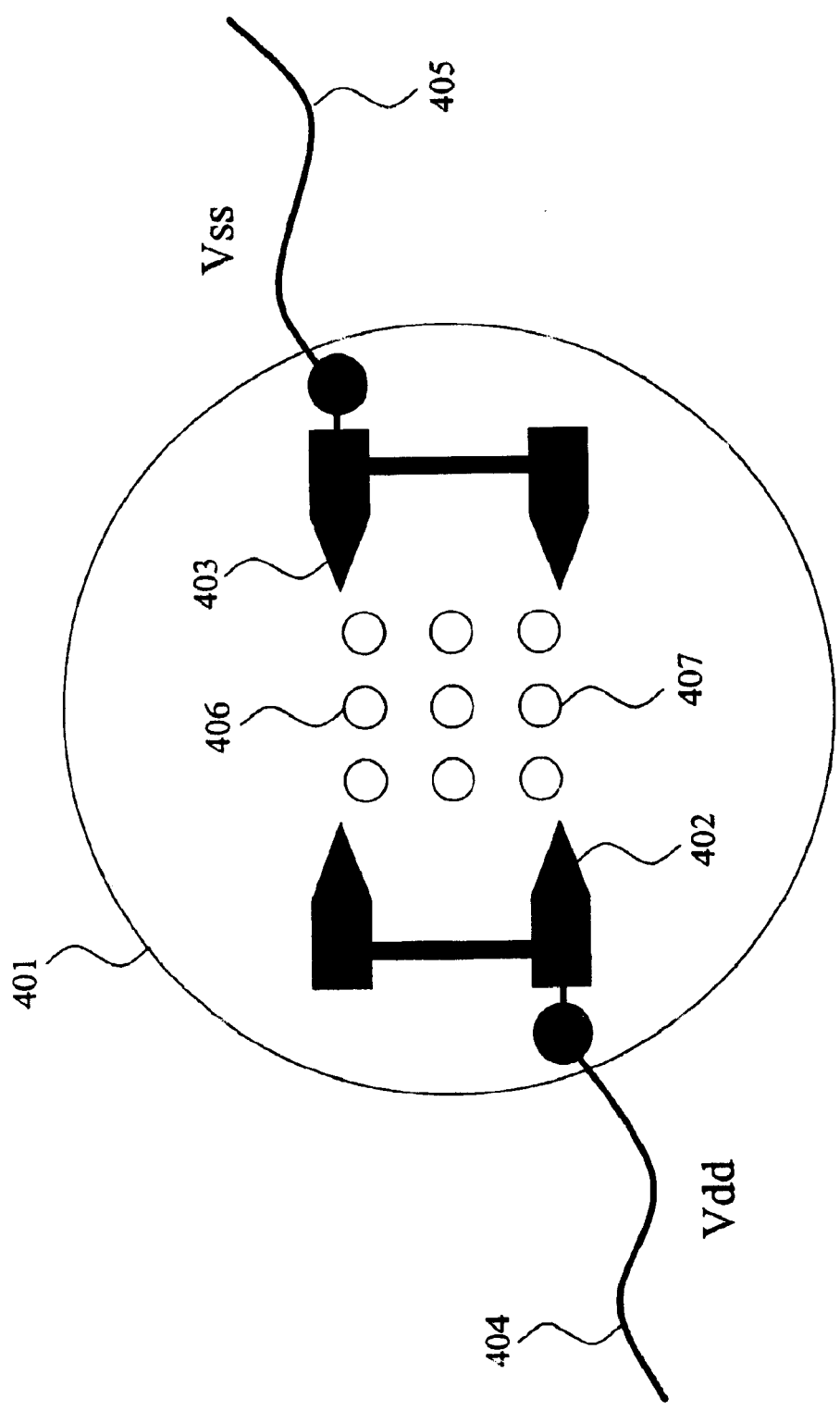
Figure 5:
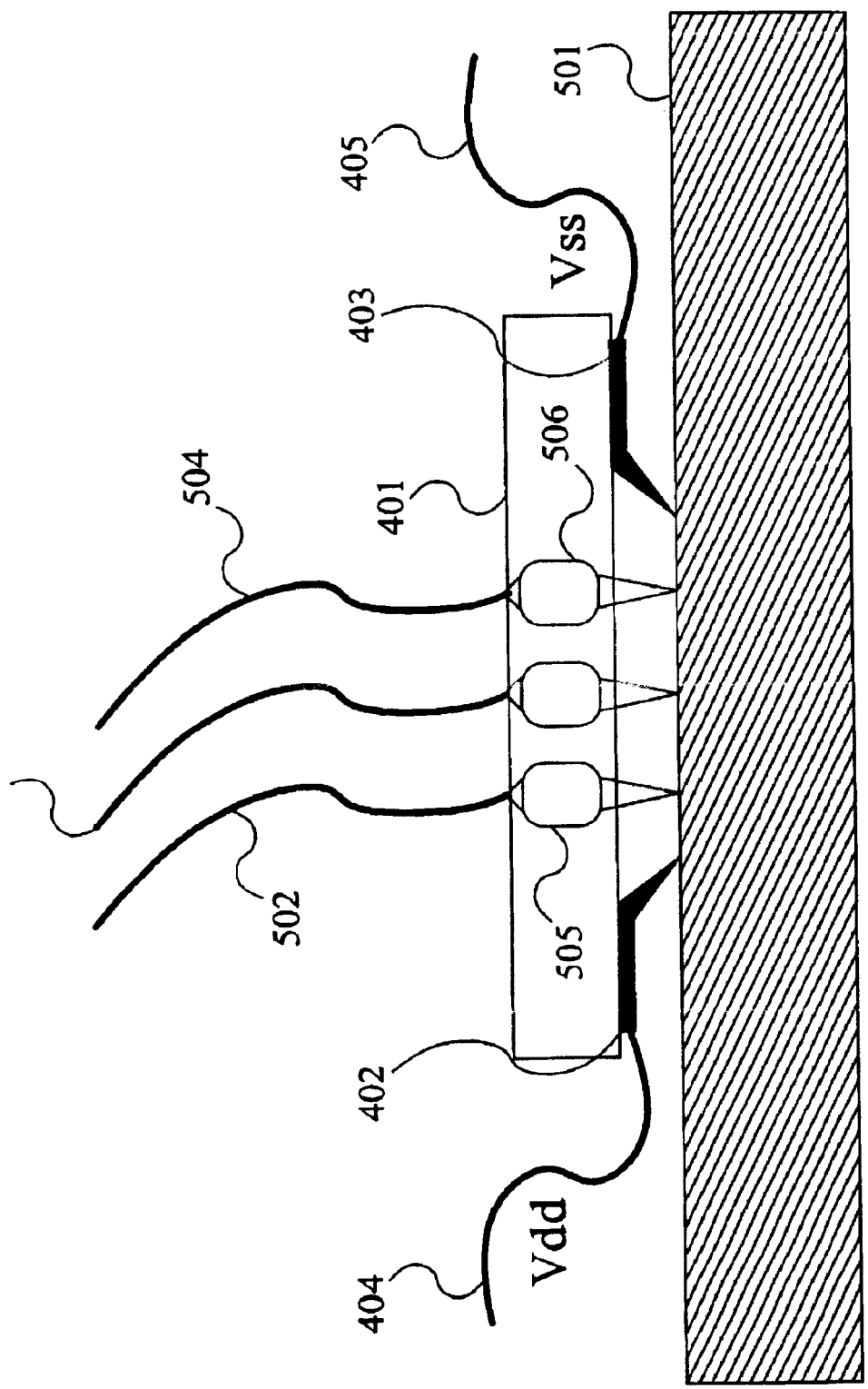
Figure 6:
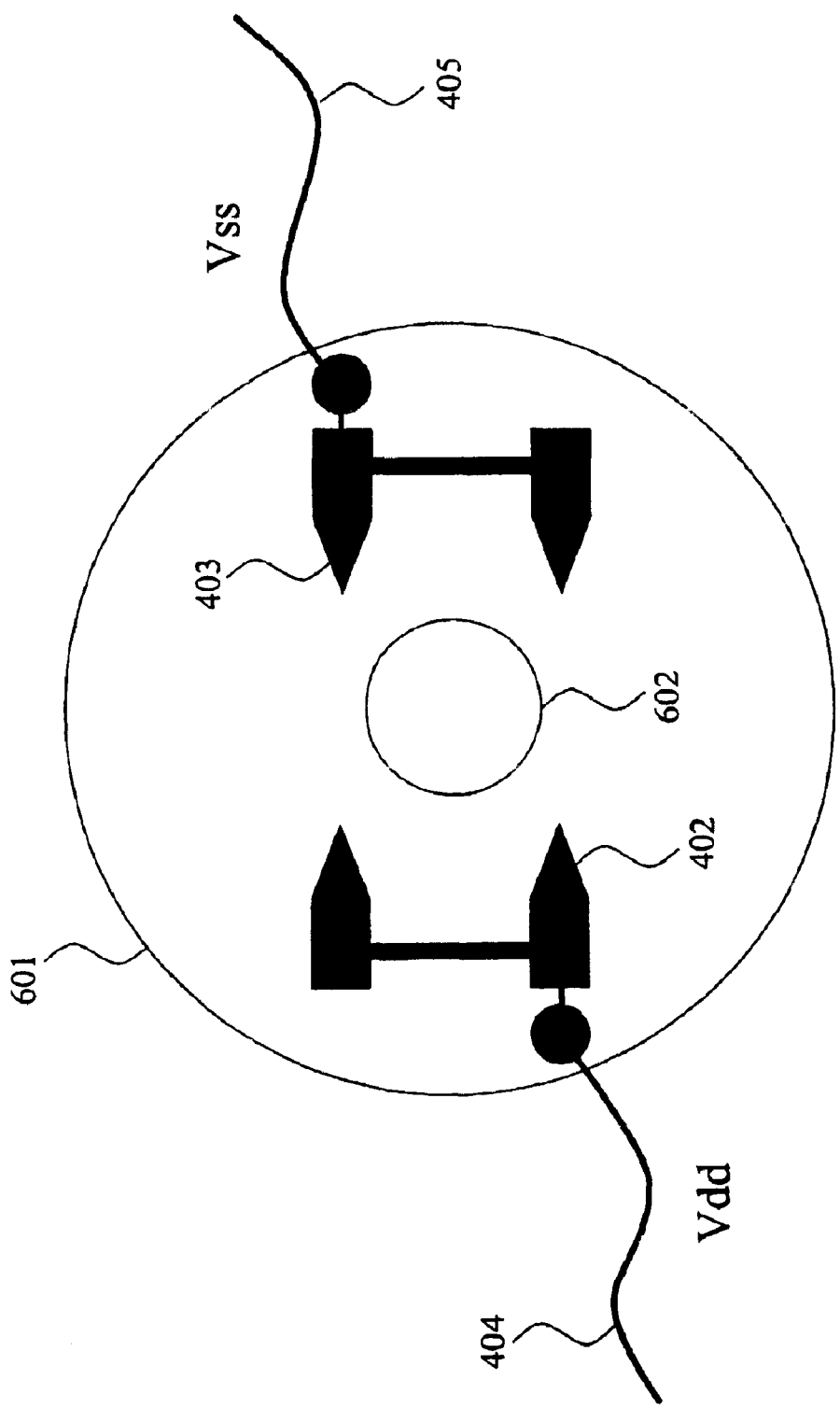
Figure 7:
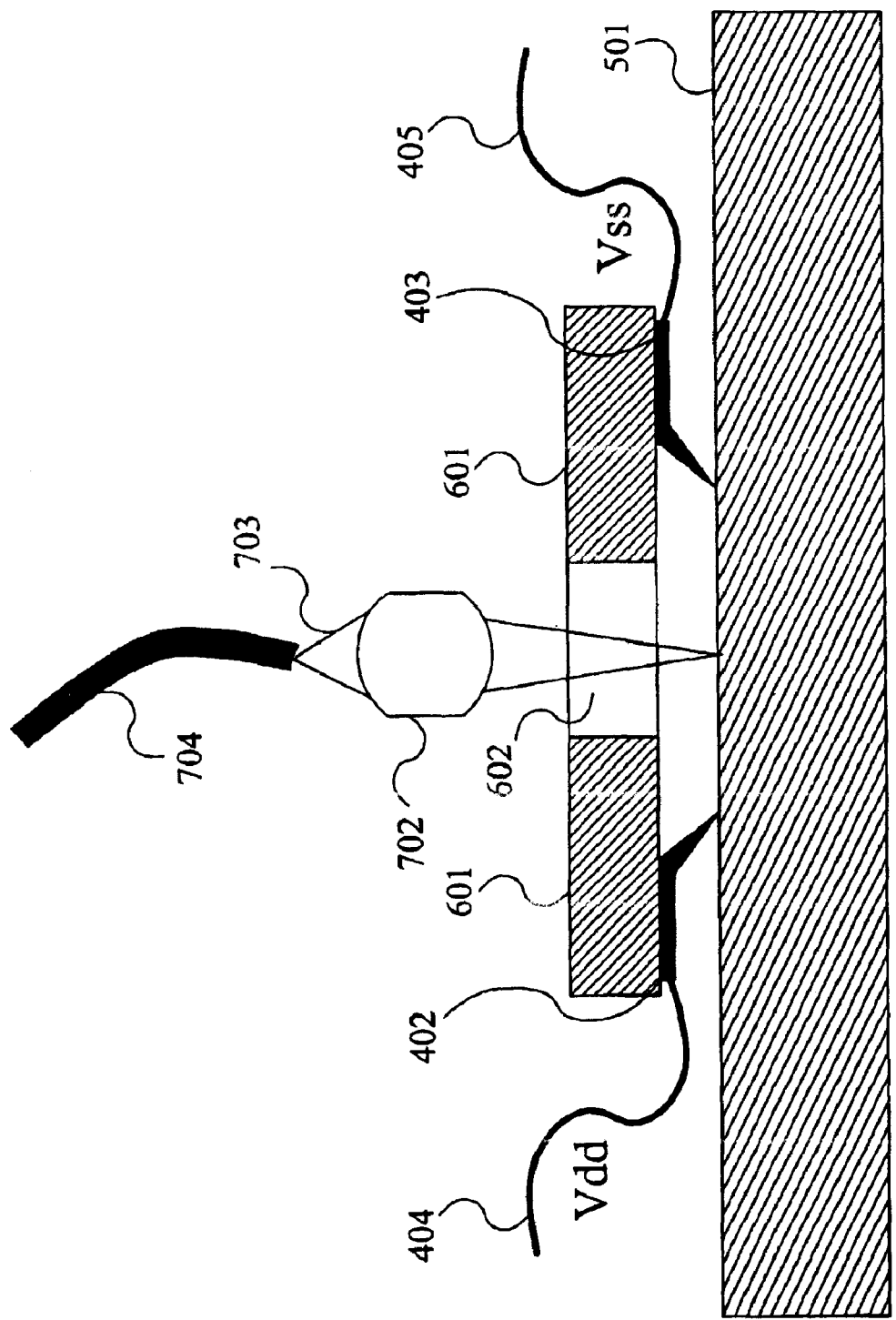
Figure 8:
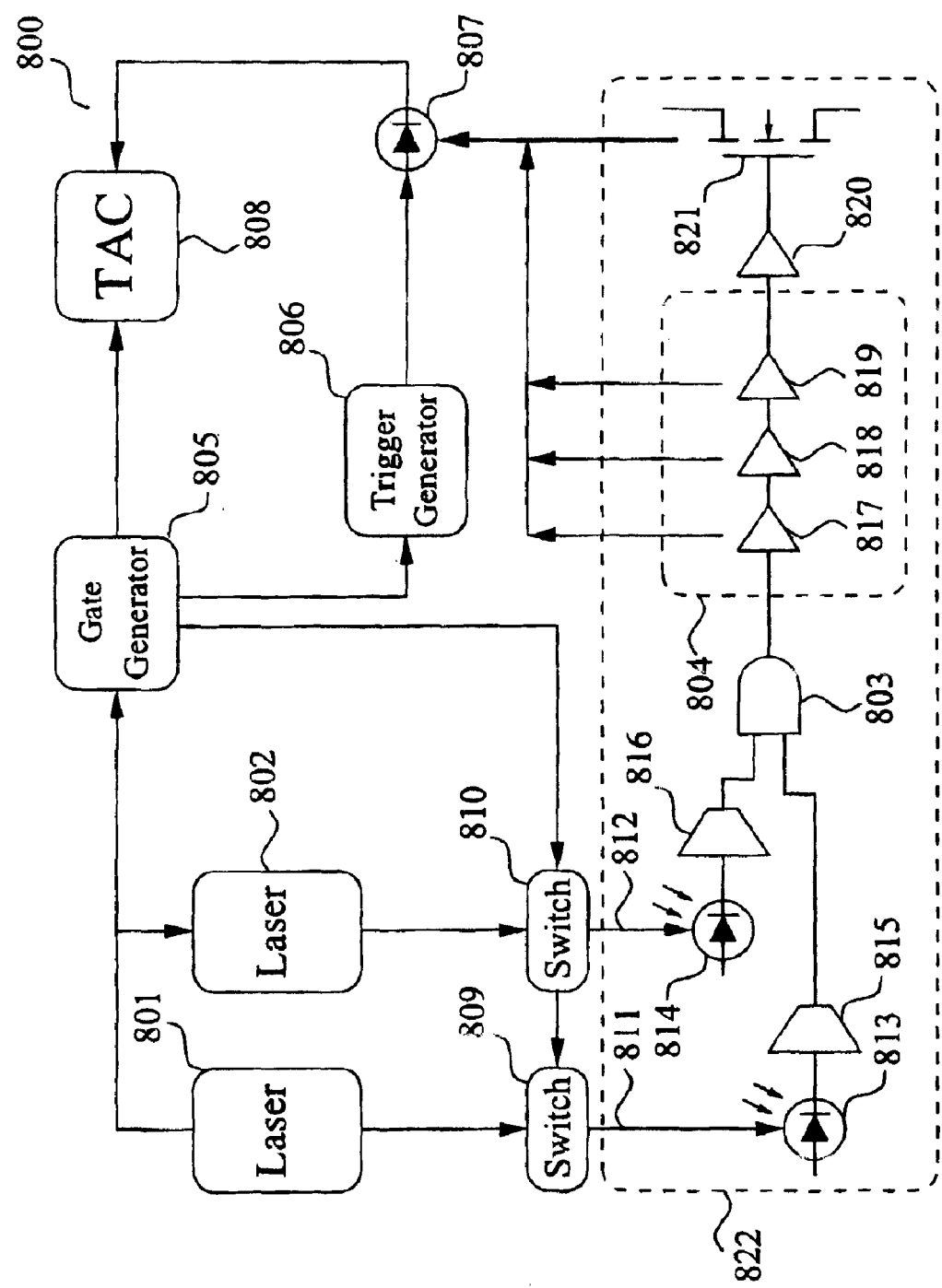

FIG. 2 illustrates a layout diagram of an exemplary embodiment of a process monitoring system 200 utilizing the inventive diagnostic technique. Such a system may be installed within a fabrication line of integrated circuits. In that figure, wafer 204 is delivered for diagnostics by a wafer handling means 210. The wafer handler 210 automatically loads the wafer 204 onto an XYZ stage 202 and 203, controlled by a stage controller 207. The XYZ stage 202 and 203, mounted on a frame 201, effectuates the positioning of the wafer 204 in a predetermined orientation relative to the probe card 205. The stage may be also used to displace the wafer such as to facilitate the probing of different sites on the wafer 204. The probe card 205 comprising optical coupling members (not shown) may direct an illuminating light onto the wafer 204. In addition, the probe card 205 may direct a stimulating light signal onto predetermined regions of the circuit under test. The stimulating light signal may be produced by a pulsed light source, such as a laser system 209. The probe card 205 may also collect the photon emissions produced by the circuit under test. DC power is supplied to the circuit using conventional mechanical probe tips 211. In the described embodiment, the wafer 204 may be placed on a temperature-controlled surface (not shown), in order to perform temperature-dependent studies. The overall operation of the diagnostic system is controlled by system electronics 208.

Figure 3:
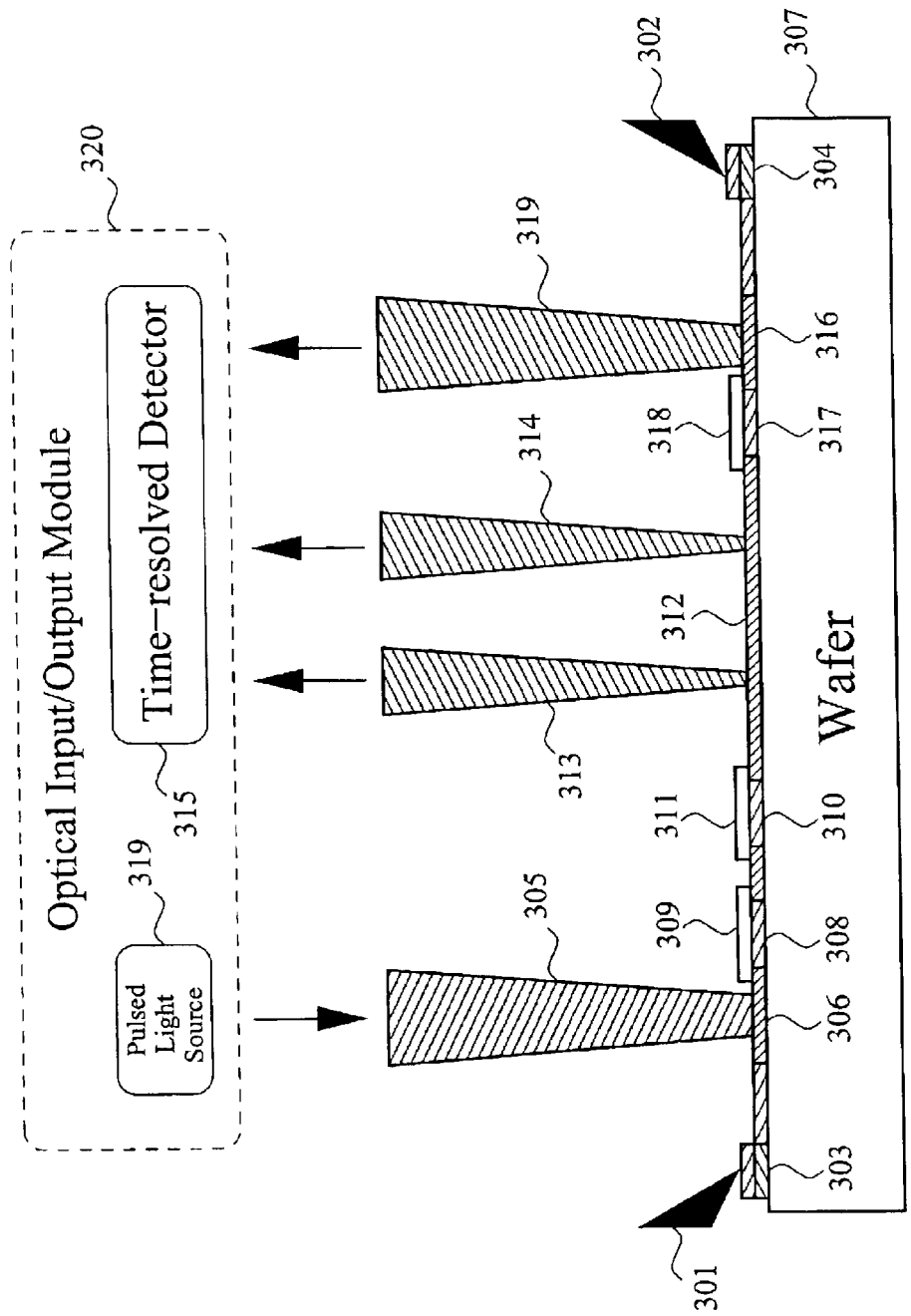
FIG. 3 depicts an exemplary embodiment of the test signal injection and detection methodology consistent with principles of the present invention.

FIG. 3 depicts an exemplary embodiment of the test signal injection and detection methodology consistent with principles of the present invention. Power and ground are provided by conventional probe pins 301 and 302 to pads 303 and 304, respectively. The pads 303 and 304 may comprise a part of metal layer M1, metal layer M2 or higher metal layers of the integrated circuit. The electrical test signal is injected into the circuit by means of a beam of stimulating radiation 305, generated by a pulsed laser source 319 and impinging on a photoreceiver 306 disposed on the wafer 307. To this end, the pulsed laser source 319 may have an optical access to the receiver 306. The electrical test signal may be buffered using buffer circuitry 308-311 and sent into the circuit under test 312. Photon emission signals 313 and 314 from the circuit 312 are detected by a time-resolved photon detector 315 and produce time-resolved photon emission signals (intrinsic emission) therein. Special structures 316–318 optimized for photon emission may be used to speed up signal acquisition time. In an embodiment of the invention, the aforementioned special structures 316–318 may comprise a large logical inverter or a transistor operating in a substantially high (higher than Vdd) biasing voltage mode. The special structures 316-318 produce an enhanced photon emission 319, which is also detected by the time-resolved detector 315 disposed within the optical input-output module 320.

Figure 4:
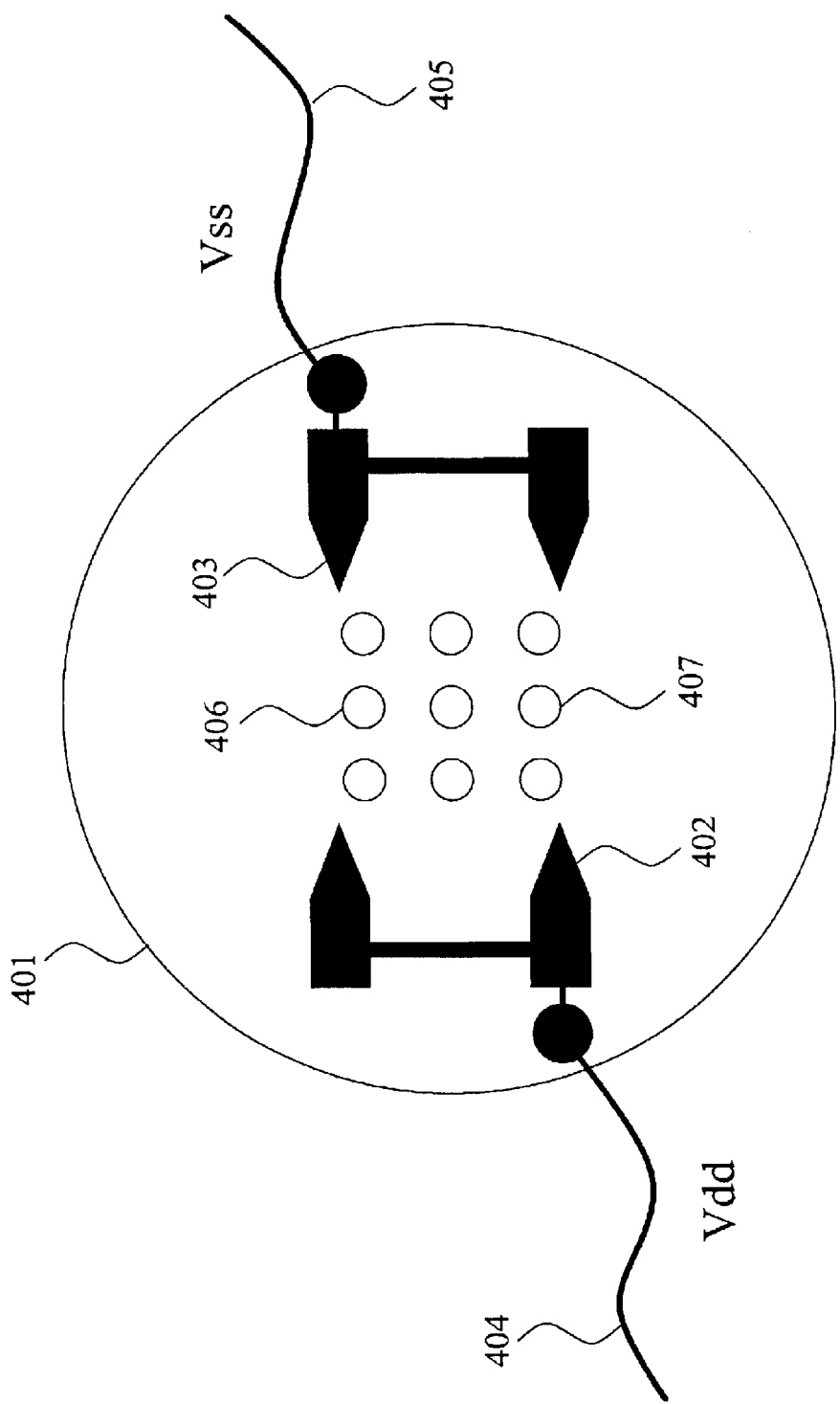
FIG. 4 depicts an exemplary embodiment of an inventive hybrid opto-electrical probe card.
Figure 5:
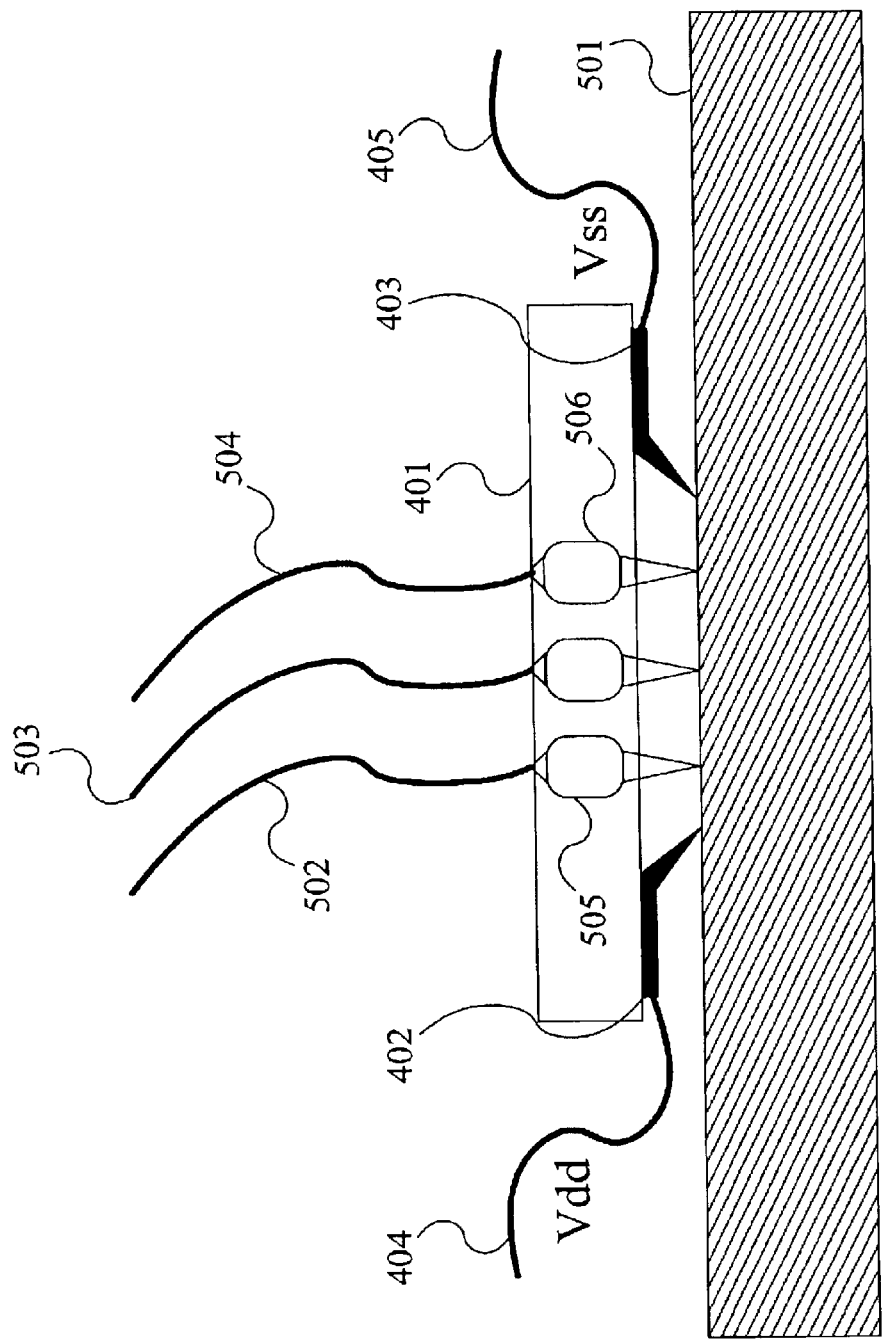
FIG. 5 depicts another view of an exemplary embodiment of the inventive hybrid opto-electrical probe card.

FIGS. 4 and 5 depict an exemplary embodiment of an inventive hybrid opto-electrical probe card 401. The shown embodiment of the probe card was designed to provide both power and test signals to the circuit under test. To this end, the probe card 401 comprises standard mechanical probe tips 402 and 403 for mechanically engaging contact areas within the circuit under test and supplying DC voltages thereto. The probes 402 and 403 are connected to an appropriate power supply voltage source using conducting wires 404 and 405, respectively. The probe card 410 may also contain optical access members, such as 406, 407, 505 and 506 for establishing optical contact with an integrated circuit disposed on a wafer 501. The optical signals are transferred to and from the probe card by means of optical fibers 502, 503 and 504. The optical members 406 and 407 comprise means (not shown) for securing the ends of the aforementioned optical fibers 502, 503 and 504 as well as focusing lenses 505 and 506, placed at a suitable distance from the fiber end so that the light coupled through the focusing lens is concentrated onto the receiver on the wafer. The depicted embodiment of the inventive probe card is designed to avoid having the probe tips 402 and 403 obstruct the optical access members 406, 407, 505 and 506. In an alternative embodiment, the power and relative ground may be provided to the circuit under test by a continuous wave (CW) laser optically coupled to photo receivers on the wafer.

Figure 6:
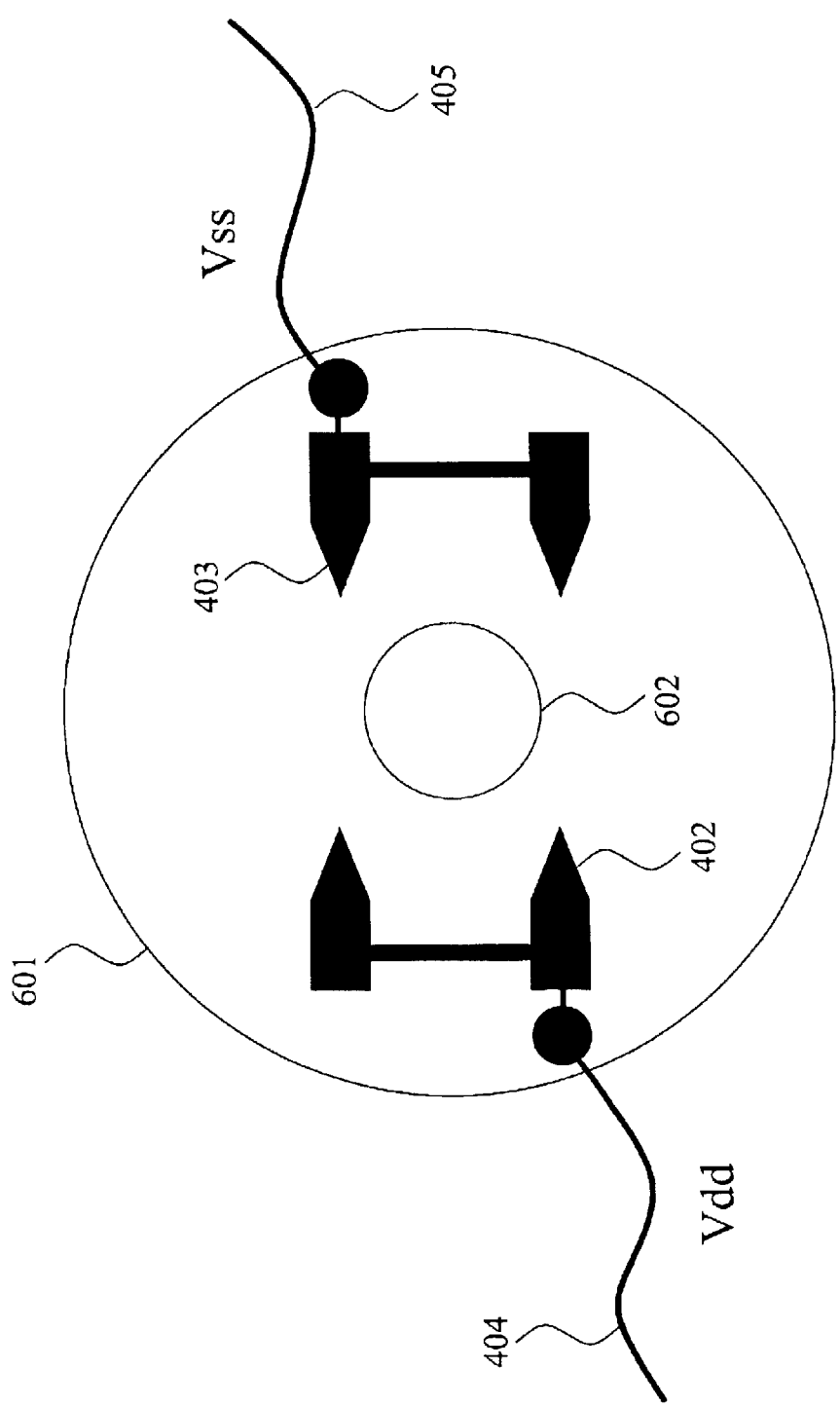
FIG. 6 depicts an exemplary embodiment of an inventive hybrid opto-electrical probe card having an open optical access.
Figure 7:
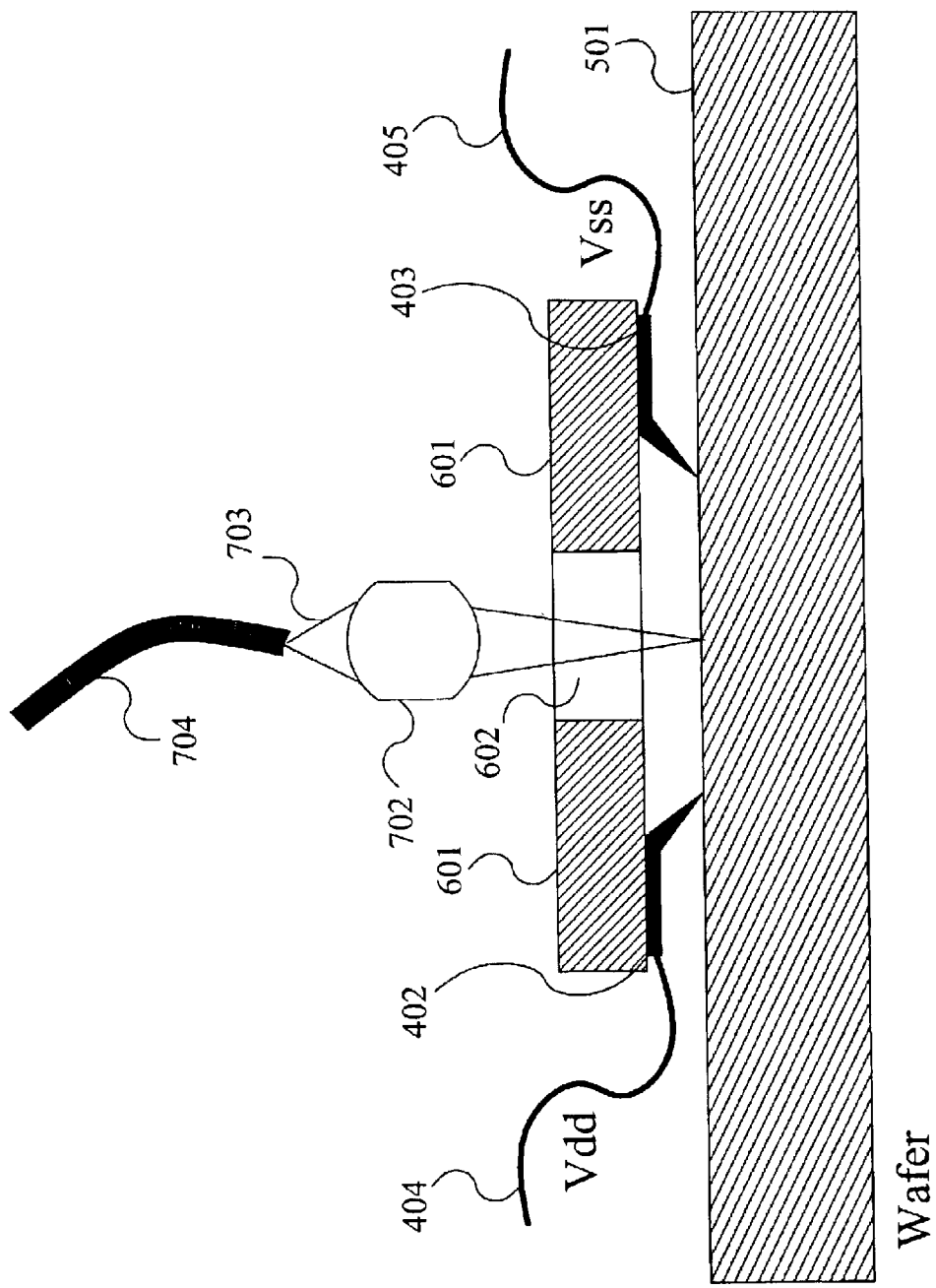
FIG. 7 depicts another view of an exemplary embodiment of the inventive hybrid opto-electrical probe card having an open optical access.

FIGS. 6 and 7 depict another exemplary embodiment of an inventive hybrid opto-electrical probe card 601 having an open optical access 602. In the shown embodiment, the focusing lens 702 is mounted above the probe card 601. The beam of light 703 delivered to the probe card by the optical fiber 704 is focused onto the surface of the wafer 501 by the focusing lens 702. This light passes through the optical access opening 602 of the probe card 601. It should be noted, that in this embodiment, the probe card 601 may move relative to the focusing lens and fiber assembly 702 and 704.

Figure 8:
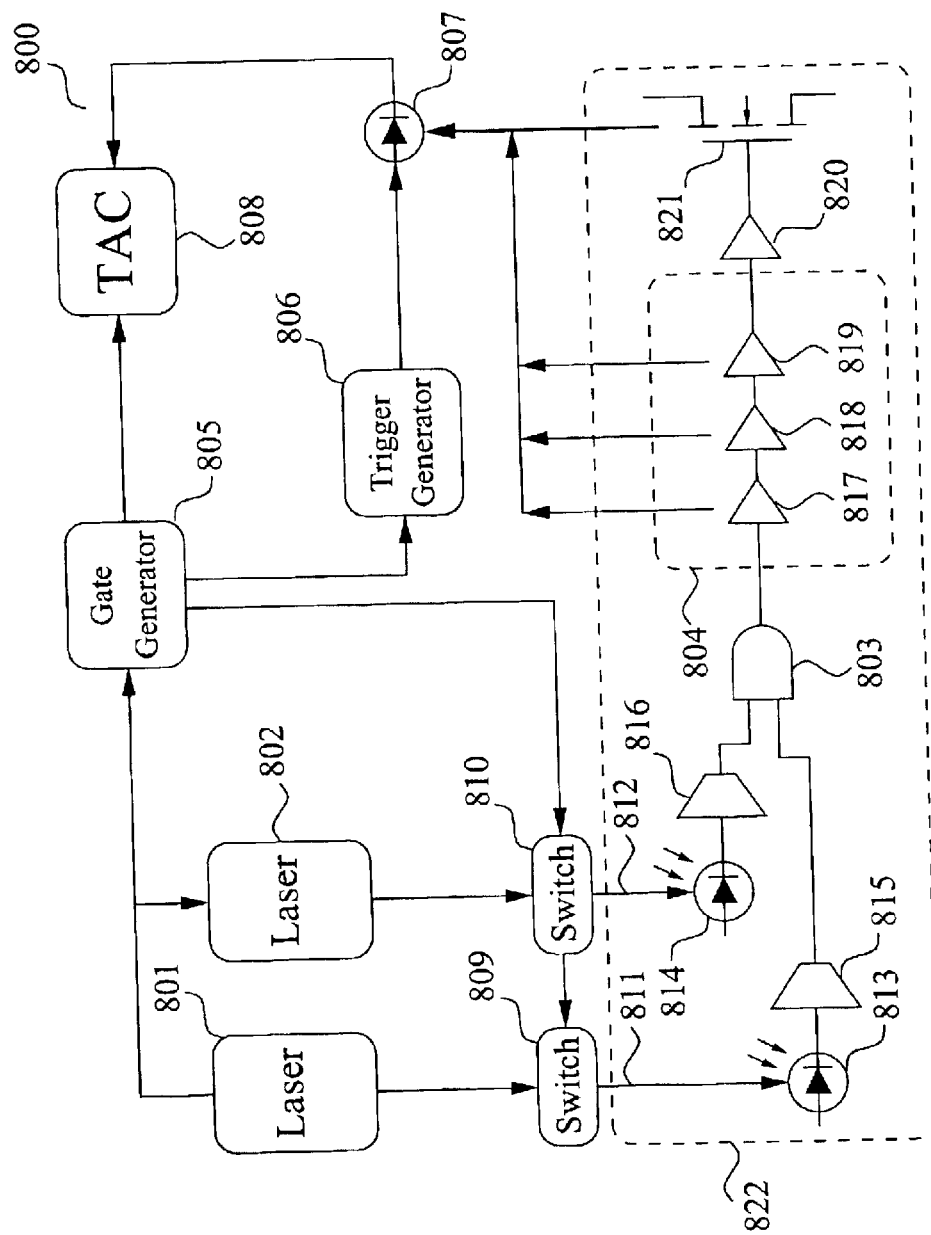
FIG. 8 depicts a schematic diagram of an exemplary embodiment of an inventive diagnostic measurement acquisition circuitry.
Figure 1:
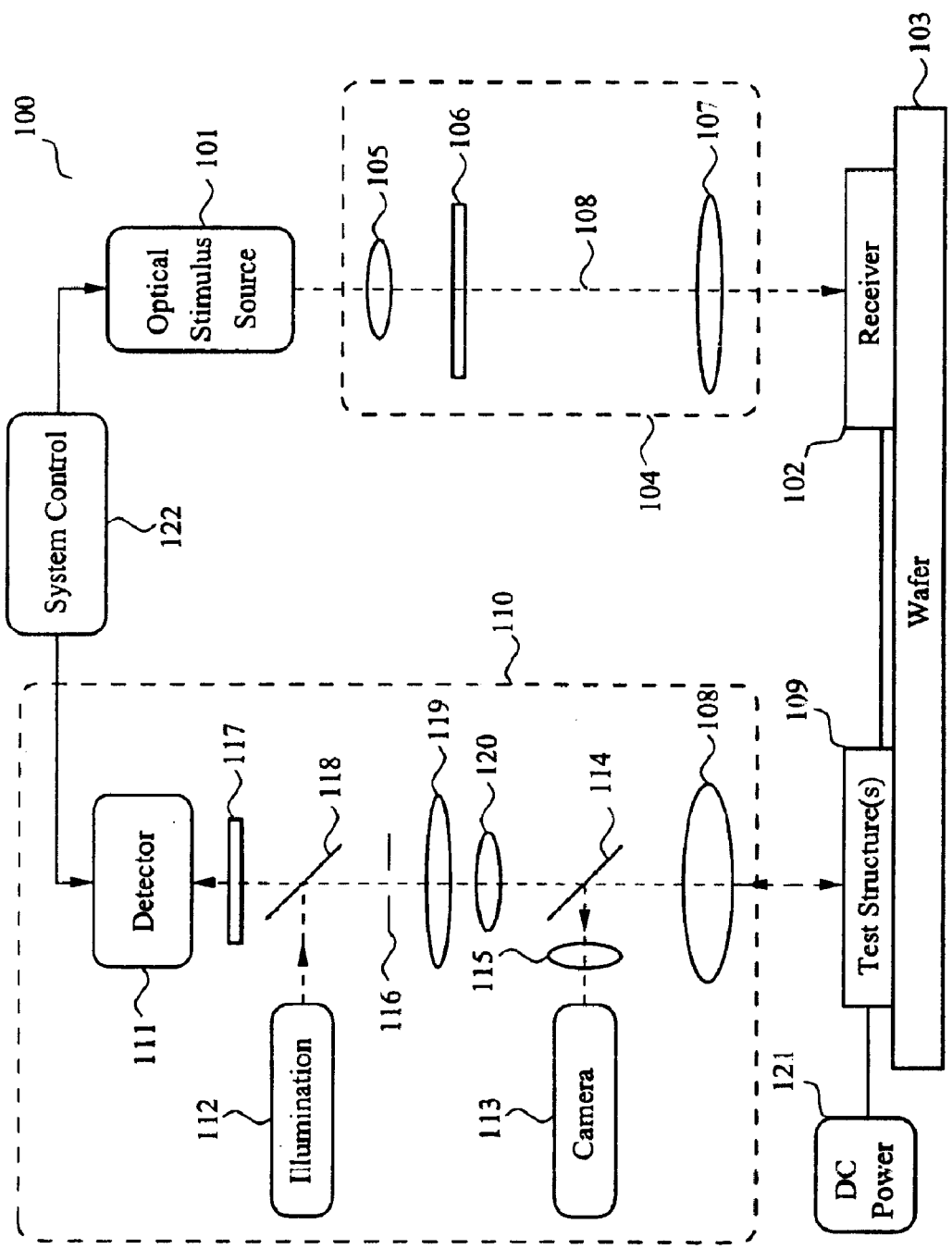

FIG. 8 depicts a schematic diagram of an exemplary embodiment of an inventive diagnostic measurement acquisition circuitry 800. In order to generate a series of test pulses with an arbitrary duty cycle, two modelocked lasers 801 and 802 could be used, one to define the rising edge (801), the other to define the falling edge of the pulse (802), in the manner shown in the figure. Alternately, a single modelocked laser could be used to create a pulse of fixed width, or the modelocked laser pulse could be split and a delay added to the second laser beam. In the system shown in FIG. 8, the optical signals generated by lasers 801 and 802 may be modulated using EO modulator switches 809 and 810. The laser pulses 811 and 812 are detected by optical receivers 813 and 814 disposed on a wafer 822. The resulting electrical signals are conditioned using buffers 815 and 816. The two output logic pulses are combined in an "AND" gate 803 to create a pulse which is input into the circuit under test 804. A gate generator 805 operating at the test signal frequency generates gate pulses for the EO modulators 809 and 810. It also provides timing signal to the trigger generator 806 for the InGaAs single photon avalanche detector (SPAD) 807, and the stop pulse for the time-to-amplitude converter (TAC) 808. The timebase of the lasers 801 and 802 and the timebase of the detector trigger generator 806 are locked together, as shown in the figure. The gates 817-819 of the test circuit emit photon signals, which are detected by the single photon avalanche detector (SPAD) 807. Special structures 820 and 821 optimized for photon emission may be provided to speed up the signal acquisition time. The time-to amplitude converter 808 provides information on the timing characteristics of the circuit under test 804.

The inventive measurement technique may be used within the production line of integrated circuit devices. Wafers may be automatically loaded into the described diagnostic system. Before testing, the diagnostic system may provide power and ground connection for the circuit under test through the standard electrical probe pins, as described above.

To effectuate the measurement of its parameters, the circuit under test must first be located on the surface of the wafer and the wafer must be displaced in such a manner as to place the circuit in a predetermined position with respect to the opto-electrical probe card. Specifically, the receiving and emitting regions of the circuit under test must be aligned with the corresponding areas of the probe card. The exact location of the circuit on the wafer may be determined using a number of suitable techniques, well known to those skilled in the art. One such method for locating a circuit on a wafer is an optical pattern recognition technique. To align the circuit under test with the probe card, the wafer may be positioned on a movable XYZ stage, which can be computer-controlled.

Once the circuit is located on the wafer and properly aligned in a predetermined manner with respect to the probe card such as to establish any required optical and/or mechanical connections, the optical stimulus system injects a modulated testing signal into the circuit under test. This signal causes a responsive electrical activity within the circuit. Photons emitted during the operation of the circuit under test are registered by the electrical activity detection apparatus. The characteristics of the circuit under test are determined based on the detected photon signal, which is indicative of the responsive electrical activity within the circuit.

The described measurements may be conducted under a variety of conditions. Specifically, the aforementioned diagnostics of the integrated circuit may be performed at different circuit temperatures as well as using different stimulus frequencies, duty cycles, patterns, or voltage amplitudes. In addition, the described diagnostic technique may be utilized to study the dependence of the performance characteristics of the integrated circuit on the voltage of the supplying power source.

It will be appreciated by persons of skill in the art that the inventive diagnostic techniques described herein may be successfully utilized in modern integrated circuit debug applications, which may include, but are not limited to: (1) studies of gate delay and speed performance; (2) measurements of device power consumption; (3) studies of conductor crosstalk and wiring capacitance; (4) measurements of leakage currents; (5) measurements of OFF currents; (6) verification of gate oxide integrity; and (7) testing and measuring of characteristics of resistive interconnects and vias.

The inventive testing concept may also find other important applications, for example, in so called silicon debug procedure, wherein measurements are performed on a wafer in a production environment to ensure that the software modeling of the integrated circuit is accurate. In addition, the inventive technique may find applications in a fabrication process monitoring and automatic process control (APC) to ensure that the process will achieve the intended circuit performance parameters such as speed and power consumption.

It will be apparent to those skilled in the art that various modifications, substitutions and variations can be made in the systems and methods of the present invention as well as in the engineering implementation of this invention without departing from the scope or spirit of the invention.

As mentioned above, the exact nature of the electrical activity detection technique is not critical to the present invention. Specifically, the photons emitted by the circuit under test may be detected using a photon-counting, time-resolved detector. Alternately, the photons may be detected in a non-time-resolved detector such as a cooled silicon charge-coupled device (CCD) detector or a liquid nitrogen cooled mercury-cadmium-telluride (MCT) detector. The aforementioned charge-coupled device (CCD) detector as well as the mercury-cadmium-telluride (MCT) detector are well known to persons of skill in the art and are commercially available.

In another embodiment, the electrical activity in the integrated circuit may be measured using a laser probe, a mechanical probe, or an electron-beam probe, as described in detail above. The photon signal, static emission signal, or laser probe signal is analyzed to provide information on the performance of the device.

Although not shown in the figures, in another implementation, the optical stimulus signal can be combined with DC parametric testing. The DC parametric testing technique is well known in the art. The implementation of such a combined measurement system may include all or some of the components described above, plus additional probe tips and measurement equipment for performing DC parametric measurements. In another embodiment, the optically injected signal can be used to perform high-speed small-signal modulation in circuits with or without various combinations of DC bias.

It should be also noted that any special structures that may be used in the integrated circuit testing process may be disposed in the areas of the wafer that would be severed from the tested integrated circuit in a subsequent sawing or dicing operation. Specifically, the aforementioned contacts, pads, buffers, amplifiers, as well as the light emitting and light receiving structures may be located, for example, in the inter-dye parts of the wafer that would be eliminated at the sawing stage of the integrated circuit fabrication process.

Finally, it will become apparent to those of skill in the art, that the inventive diagnostic technique may be used to test integrated circuits at various stages of the fabrication process. Specifically, partially processed semiconductor wafers may be diagnostically tested according to the principles described herein after being subjected to any appropriate step of the integrated circuit production cycle. Moreover, the testing of the functionally complete integrated circuit may be performed before and even after the packaging.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention.

Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for measuring electrical characteristics of an integrated circuit, said integrated circuit comprising predetermined patterns of active electronic elements disposed on a surface of a semiconductor wafer, said apparatus comprising: a stimulating energy source for injecting a test signal into said integrated circuit by stimulating predetermined areas of said integrated circuit; power source for supplying power to at least one of said active electronic elements of said integrated circuit; and a detector for detecting an electrical activity within sad integrated circuit in response to said injected test signal, wherein said responsive electrical activity comprises switching of at least one of said active electronic elements of said integrated circuit and wherein said characteristics on said integrated circuit are determined based on said detected electrical activity.

2. The apparatus of claim 1, wherein said detector operates to detect said electrical activity in said integrated circuit in an electrically non-loading manner.

3. The apparatus of claim 1, wherein said stimulating energy source operates to inject said test signal without establishing a mechanical contact with said predetermined stimulated areas of said integrated circuit.

4. The apparatus of claim 1, wherein said stimulating energy source stimulates said predetermined areas of said integrated circuit by directing a beam of electromagnetic radiation onto said predetermined areas.

5. The apparatus of claim 1, wherein said predetermined areas of said integrated circuit are stimulated using a beam of charged particles emitted by said stimulating energy source.

6. The apparatus of claim 1, wherein said test signal injected into said circuit is conditioned using a signal conditioning device disposed within said integrated circuit.

7. The apparatus of claim 1, wherein before said injecting, said integrated circuit is located on a wafer and positioned in a predetermined manner with respect to said stimulating energy source and said detector.

8. The apparatus of claim 7, wherein said integrated circuit is located on said wafer using an image of said wafer and performing an optical pattern recognition analysis of said image.

9. The apparatus of claim 7, wherein said integrated circuit is positioned with respect to said stimulating energy source and said detector using a mechanical stage.

10. The apparatus of claim 1, wherein before said injecting, an electrical power is supplied to said integrated circuit.

11. The apparatus of claim 10, wherein said electrical power is supplied to said integrated circuit by disposing a photoreceiver within said circuit and irradiating said photoreceiver using an energy beam.

12. The apparatus of claim 10, wherein said electrical power is supplied to said integrated circuit using at least one mechanical probe engaging at least one conducting pad disposed within said integrated circuit.

13. The apparatus of claim 1, wherein said injecting is performed after deposition of a metal layer of said integrated circuit.

14. The apparatus of claim 1, further comprising a setup for performing parametric measurements on said integrated circuit, wherein results of said parametric measurements are used in determining characteristics of said integrated circuit.

15. The apparatus of claim 1, wherein said detecting of electrical activity within said integrated circuit is performed using a non-time-resolved detection of photons emitted by said integrated circuit.

16. The apparatus of claim 1, wherein said detecting of electrical activity within said integrated circuit is performed using a time-resolved detection of photons emitted by said integrated circuit.

17. The apparatus of claim 1, wherein said detecting of electrical activity within said integrated circuit is performed using a laser beam probing of said integrated circuit.

18. The apparatus of claim 1, wherein said detecting of electrical activity within said integrated circuit is performed using at least one mechanical probe engaging at least one conducting pad disposed within said integrated circuit.

19. The apparatus of claim 1, wherein said detecting of electrical activity within said integrated circuit is performed using an electron-beam probing of said integrated circuit.

* * * * *

UNITED STATES PATENT AND TRADEMARK OFFICE
CERTIFICATE OF CORRECTION

| | |
|---|---|
| PATENT NO. | : 6,859,031 B2 |
| APPLICATION NO. | : 10/229181 |
| DATED | : February 22, 2005 |
| INVENTOR(S) | : Pakdaman et al. |

It is certified that error appears in the above-identified patent and that said Letters Patent is hereby corrected as shown below:

Delete the title page and columns 16-18 to be replaced with the title page showing 62 claims and columns 16-20 as shown on the attached pages.

Signed and Sealed this

Fourth Day of July, 2006

JON W. DUDAS
*Director of the United States Patent and Trademark Office*

United States Patent
Pakdaman et al.

(10) Patent No.: US 6,859,031 B2
(45) Date of Patent: Feb. 22, 2005

(54) APPARATUS AND METHOD FOR DYNAMIC DIAGNOSTIC TESTING OF INTEGRATED CIRCUITS

(75) Inventors: Nader Pakdaman, Los Gatos, CA (US); Steven Kasapi, San Francisco, CA (US); Itzik Goldberger, Redwood City, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/229,181

(22) Filed: Aug. 26, 2002

(65) Prior Publication Data

US 2003/0146761 A1 Aug. 7, 2003

Related U.S. Application Data

(60) Provisional application No. 60/353,374, filed on Feb. 1, 2002.

(51) Int. Cl.$^7$ .............................. G01N 27/72
(52) U.S. Cl. ........................... 324/233
(58) Field of Search ................. 324/752, 233, 483

(56) References Cited

U.S. PATENT DOCUMENTS

| | | |
|---|---|---|
| 4,681,449 A | 7/1987 | Bloom et al. |
| 4,758,092 A | 7/1988 | Heinrich et al. |
| 5,508,610 A * | 4/1996 | Feeney ............ 324/233 |
| 5,631,571 A * | 5/1997 | Spaziani et al. ...... 324/752 |
| 5,640,539 A | 6/1997 | Goishi et al. |
| 5,663,967 A | 9/1997 | Prasad et al. |
| 5,721,688 A * | 2/1998 | Bramwell .......... 324/483 |
| 5,872,360 A | 2/1999 | Paniccia et al. |
| 5,905,577 A | 5/1999 | Wilsher et al. |
| 5,940,545 A | 8/1999 | Kash et al. |
| 5,949,900 A | 9/1999 | Nakamura et al. |
| 6,107,107 A | 8/2000 | Bruce et al. |
| 6,184,696 B1 | 2/2001 | White et al. |

FOREIGN PATENT DOCUMENTS

EP 0 652 444 A 5/1995

OTHER PUBLICATIONS

K. Soumyanath et al., "Accurate On–Chip Interconnect Evaluation: A Time–Domain Technique", IEEE Journal of Solid–State Circuits, vol. 34, No. 5, pp. 623–631, May 1999.
Hirotaka Komoda et al., "Optical Beam Induced Current Techniques for Failure Analysis of Very Large Scale Integrated Circuit Devices," Japanese Journal of Applied Physics, Tokyo, JP, vol. 33, No. 6A, Part 1, Jun. 1, 1994, pp3393–3401.

(List continued on next page.)

*Primary Examiner*—John F. Niebling
*Assistant Examiner*—Andre' C. Stevenson
(74) *Attorney, Agent, or Firm*—Pavel Pogodin, Esq.

(57) ABSTRACT

Systems and methods consistent with principles of the present invention allow contactless measuring of various kinds of electrical activity within an integrated circuit. The invention can be used for high-bandwidth, at speed testing of various devices on a wafer during the various stages of device processing, or on packaged parts at the end of the manufacturing cycle. Power is applied to the test circuit using conventional mechanical probes or other means, such as CW laser light applied to a photoreceiver provided on the test circuit. The electrical test signal is introduced into the test circuit by stimulating the circuit using a contactless method, such as by directing the output of one or more modelocked lasers onto high-speed receivers on the circuit, or by using a high-speed pulsed diode laser. The electrical activity within the circuit in response to the test signal is sensed by a receiver element, such as a time-resolved photon counting detector, a static emission camera system, or by an active laser probing system. The collected information is used for a variety of purposes, including manufacturing process monitoring, new process qualification, and model verification.

62 Claims, 8 Drawing Sheets

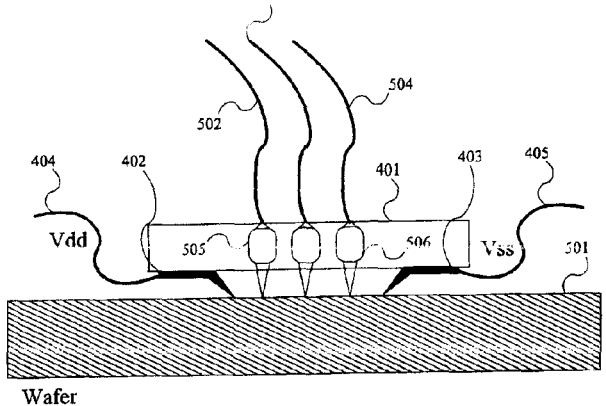

OTHER PUBLICATIONS

Manus et al., "Invited Picosecond Imaging Circuit Analysis of ULSI Microprocessors," 2002 IEEE MIT-S International Mocrowave Symposium Digest (IMS 2002), Seattle, WA Jun. 2–7, 2002, IEEE MTT-S International Microwave Symposium, New York, NY; IEEE, US, vol. 3 of 3. Jun. 2, 2002, pp. 1505–1508 ISBN: 0-7803-7239-5.

H. H. Berger et al., "Contactless Function Test of Integrated Circuits on the Wafer," Proceedings of the 22nd International Symposium for Testing and Failure Analysis, Nov. 18–22, 1996, Los Angeles, California, pp. 263–266.

F. Esfahani et al., "Small Area Optical Inputs for High Speed CMOS Circuits," Ninth Annual IEEE International ASIC Conference and Exhibit, Sep. 23-27, 1996, Rochester, New York, pp. 7–10.

H. Zimmerman & T. Heide, "A Monolithically Integrated 1-Gb/s Optical Receiver in 1-$\mu$m CMOS Technology," IEEE Photonics Technology Letters, vol. 13, No. 7, Jul. 2001, pp 711–713.

N. Khurana & C-L Chiang, "Analysis of Product Hot Electron Problems by Gated Emission Microscopy," International Reliability Physics Symposium, 1986, pp. 189–194.

F. Esfahani, "Testability Improvement of Highly Integrated Circuits by Optical Injection of Logical Levels into the Circuit," 1997, pp. 288–295.

P. Bellutti et al., "Fowler Nordheim Induced Light Emission from MOS Diodes," IEEE 2000 International Conference on Microelectronic Test Structures, pp. 223–226.

H. H. Berger et al., "Optical Signal Injection for High-Speed Wafer Level Function of Integrated Circuits," IEEE 1997 International Conference on Microelectronic Test Structures, vol. 10, Mar. 1997, pp. 39–42.

T. Ohzone et al., "A Study on Hot-Carrier-Induced Photoemmision in n-MOSFETs under Dynamic Operation," IEEE 2000 International Conference on Microelectronic Test Structures, pp. 75–80.

H. Zimmermann et al., "Monolithic High-Speed CMOS-Photoreceiver," IEEE Photonics Technology Letters, vol. 11, No. 2, Feb. 1999, pp. 254–256.

B. R. Hemenway et al., "Optical Detection of Charge Modulation in Silicon Integrated Circuits Using a Multimode Laser-Diode Probe," IEEE Electron Device Letters, vol. EDL-8, No. 8, Aug. 1987, pp. 344–346.

H. K. Heinrich et al, "Picosecond Backside Optical Detection of Internal Signals in Flip-Chip Mounted Silicon VLSI Circuits," Microelectronic Engineering, vol. 16, 1992, pp. 313–324.

H. K. Heinrich et al., "Backside Optical Measurements of Picosecond Internal Gate Delays in a Flip-Chip Packaged Silicon VLSI Circuit," IEEE Photonics Technology Letters, vol. 3, No. 7, Jul. 1991, pp. 673–675.

\* cited by examiner

APPARATUS AND METHOD FOR DYNAMIC DIAGNOSTIC TESTING OF INTEGRATED CIRCUITS

CROSS-REFERENCE TO RELATED APPLICATION

This regular U.S. patent application is based on and claims the benefit of U.S. Provisional patent application Ser. No. 60/353,374, filed Feb. 1, 2002, the entire disclosure of which is relied upon and incorporated by reference herein.

FIELD OF THE INVENTION

The present invention generally relates to testing of integrated circuits, and more specifically to in-line high-bandwidth dynamic diagnostic testing of integrated circuits in the semiconductor device fabrication environment.

DESCRIPTION OF THE RELATED ART

Modern integrated circuits (ICs), such as high-performance microprocessor chips, are manufactured by creating pre-determined patterns of electronic components, such as logic gates, on a surface of a semiconductor wafer. The aforementioned electronic components are created on the wafer using a series of individual operations, or fabrication process steps. Such steps may include, but are not limited to, coating the surface of the wafer with photoresist, exposing the coated surface to the incident beam of light, performing chemical or plasma etching of the surface, deposition of material (i.e. metal or oxide), etc. The entire sequence of these steps, performed in a predetermined order, is called the semiconductor fabrication process, or simply process.

If, during the mass production of microelectronic devices, one or more process steps have been designed improperly or perhaps implemented incorrectly, the resulting integrated circuits may be faulty or may not perform to their expected performance specifications. As will be readily appreciated by those of skill in the art, it is be desirable to detect the fabrication process step failure or deviation from the process parameters as early as possible. Firstly, advanced integrated circuit fabrication and packaging processes are very costly. Therefore, it is desirable to continuously monitor the fabrication process in order to identify and remove from production the devices that are faulty or out of the pre-defined performance range before incurring additional costs by performing any subsequent fabrication and/or packaging steps on faulty devices. Secondly, it is imperative to identify and correct the faulty fabrication process step(s) or procedure(s) as soon as practical in order to prevent further deviation from specifications and production of non (or under) performing devices on the subsequent wafers. To this end, it is desirable to monitor continuously the vital performance characteristics (i.e. power draw or operating clock speed) of the manufactured devices.

Numerous electrical test methods have been developed to monitor the quality and integrity of the integrated circuit fabrication process. All such methods are based on predicting the performance of the completed integrated circuits, using the measurements obtained from partially processed wafers. According to one such method, the process robustness is monitored by using the results of certain parametric measurements to determine the key process-related parameters. For example, the thickness of the oxide film on the wafer can be determined through the resistivity measurements. In addition, the aforementioned parametric measurements can be used to determine specific critical device parameters that are directly tied into the fabrication process. For example, one could use the threshold voltage to determine the doping levels of the diffusions. These parametric measurements are performed at different stages on the partially processed wafer.

Parametric measurements are performed specifically to measure physical and electrical parameters related to the process, and do not directly determine circuit performance such as circuit speed. In other words, there is only an indirect relationship between the parametric measurements and the actual device performance. Exemplary parametric measurements include the measurements of transistor threshold voltage and off current leakage. During these measurements, electrical and process tests constant (DC) voltage or small-signal (AC) voltage is applied to predetermined locations on the wafer to activate the device structures at several discrete locations across the wafer. The integrity of the process is verified by comparing the values of the measured DC circuit parameters with a set of expected values.

However, as the geometry of the integrated circuits becomes smaller, the aforementioned parametric measurements as well as the traditional measurements of critical dimensions (also called geometrical circuit parameters) are becoming less effective at predicting and monitoring the final circuit performance behavior. This limitation of the existing techniques becomes especially significant for deep sub-micron geometry integrated circuits. The term deep sub-micron geometry circuits, used herein, describes circuits with characteristic linewidth dimensions of less than 0.25 microns. Specifically, the DC parametric measurements as well as the measurements of critical dimensions do not allow accurate prediction of at-speed (high frequency) parameters of such circuits. The correlation between device's performance (i.e. timing, speed, etc.) and the measured DC parameters, geometrical parameters or the physical process parameters is becoming even weaker for devices with even smaller line width dimensions, hereinafter referred to as sub-0.13 micron devices.

As integrated circuit manufacturers change their manufacturing processes to smaller linewidth dimensions, performance-related issues that could previously be ignored start to become significant. Process variability, inherent in large scale manufacturing of advanced products as well as monitoring thereof, further exacerbates the aforementioned weak correlation problem and makes it even more difficult to design and fabricate with high yield advanced products and perform the needed fabrication process characterization.

Finally, traditional mechanical probes used to couple test signals into partially processed integrated circuits suffer from reliability problems caused by the probe needles scratching and damaging the contact pads as well as poor high frequency performance. Mechanical probes can also produce debris, which may result in contamination of the wafer. These traditional signal injection and measurement acquisition methods are not suitable for high-frequency, high-bandwidth, in-line production testing of integrated circuits required by the industry.

Accordingly, current diagnostic techniques (both metrological and electrical) are deficient in their ability to provide high-bandwidth contactless electrical measurements on an integrated circuit at the wafer level. Furthermore these traditional approaches are ineffective at providing critical performance information (such as speed, timing, and power consumption) that is the final determining factor in fabrication and design robustness.

SUMMARY OF THE INVENTION

The present invention is directed to methods and systems that substantially obviate one or more of the above and other problems associated with metrology and electrical test of advanced IC design and manufacturing. Consistent with exemplary embodiments of the present invention, there are provided methods for dynamic in-line diagnostics of integrated circuits.

According to an embodiment of the inventive method, a test signal is injected into the integrated circuit by electrically stimulating predetermined areas of the integrated circuit using a stimulating energy source. The stimulating energy source may provide the stimulating energy to the areas of the integrated circuit without a mechanical contact therewith. Subsequent electrical activity produced within the integrated circuit in response to the injected test signal is detected using a detector. Finally, the characteristics of the integrated circuit are determined based on the detected electrical activity.

According to a feature of the inventive method, the electrical activity in the integrated circuit may be detected in a manner that does not electrically "load" the circuit using a passive, non-invasive method.

According to another aspect of the invention, there is provided an apparatus for measuring electrical characteristics of an integrated circuit. The inventive apparatus may comprise a stimulating energy source for injecting a test signal into the integrated circuit by stimulating areas of the integrated circuit without mechanical contact of the stimulating energy source with the stimulated areas of the circuit. In addition, the inventive apparatus may also include a detector for detecting an electrical activity within the integrated circuit in response to the injected test signal. The detected electrical activity may be used to determined characteristics of the integrated circuit.

According to a feature of the inventive apparatus, the detector may operate to detect the electrical activity in the integrated circuit in an electrically non-loading or minimally-loading manner.

Additional aspects related to the invention will be set forth in part in the description which follows, and in part will be obvious from the description, or may be learned by practice of the invention. Aspects of the invention may be realized and attained by means of the elements and combinations particularly pointed out in the appended claims.

It is to be understood that both the foregoing and the following descriptions are exemplary and explanatory only and are not intended to limit the claimed invention in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically:

FIG. 1 illustrates an exemplary embodiment of a diagnostic system consistent with the principles of the present invention;

FIG. 2 depicts a layout diagram of an exemplary embodiment of a process monitoring system utilizing the inventive diagnostic technique;

FIG. 3 depicts an exemplary embodiment of the test signal injection and detection methodology consistent with principles of the present invention;

FIG. 4 depicts an exemplary embodiment of an inventive hybrid opto-electrical probe card;

FIG. 5 depicts another view of an exemplary embodiment of the inventive hybrid opto-electrical probe card;

FIG. 6 depicts an exemplary embodiment of an inventive hybrid opto-electrical probe card having an open optical access.

FIG. 7 depicts another view of an exemplary embodiment of the inventive hybrid opto-electrical probe card having an open optical access.

FIG. 8 depicts a schematic diagram of an exemplary embodiment of an inventive diagnostic measurement acquisition circuitry.

DETAILED DESCRIPTION

In the following detailed description, reference will be made to the accompanying drawings, in which identical functional elements are designated with like numerals. The aforementioned accompanying drawings show by way of illustration, and not by way of limitation, specific implementations consistent with principles of the present invention. These implementations are described in sufficient detail to enable those skilled in the art to practice the invention and it is to be understood that other implementations may be utilized and that structural changes may be made without departing from the scope and spirit of present invention. The following detailed description is, therefore, not to be construed in a limited sense.

Systems and methods consistent with principles of the present invention allow contactless high-bandwidth dynamic testing of integrated circuits on partially or completely processed wafers or packaged devices. Compared to the existing technology, the inventive diagnostic method has a potential for identification of a wider range of fabrication process failures during both the design and fabrication of the integrated circuit process as well as the control thereof. Specifically, the inventive technique provides means for direct measurement of high-speed, high-bandwidth dynamic characteristics of an integrated circuit at the wafer level. Some features of the inventive technique may include, but are not limited to: (1) the use of non-invasive, non-contact probing (except, possibly, for DC circuit power and ground); (2) the ability to perform measurements at early stages of the process (i.e. Metal Level 1 (M1) and Metal Level 2 (M2) layers); (3) the ability to perform early screening of process problems; (4) the ability to perform high-speed dynamic measurements; (5) the ability to perform gate-to-gate delay timing; (6) the ability to measure switching time of transistors; (7) the ability to measure temperature-dependent phenomena using a temperature-controlled wafer chuck; and (8) the ability to measure relative current in junction. In view of these and other features of the inventive technique, it will become apparent to persons of skill in the art that the inventive methodology may have applications in both the fabrication process development and the process monitoring. In addition, the inventive method is compatible with current semiconductor manufacturing methodologies.

According to an embodiment of the inventive diagnostic technique, predetermined areas of an integrated circuit under test are stimulated using a source of stimulating energy. The exact nature of this stimulating energy is not essential in the present invention. Specifically, the aforementioned stimulating energy source may be a source of electromagnetic radiation, such as a laser. Alternatively, the stimulating energy source may be a source of charged particles, such as an electron beam source or a mechanical probe. When applied to the circuit under test, the stimulating energy induces an electrical test signal within the circuit. To this end, the stimulating energy may be directed towards one or more "receivers" disposed within the proximity of the surface of the integrated circuit.

The aforementioned electrical test signal injected into the circuit under test by means of the stimulating energy source stimulates an electrical response within the circuit. In order to determine whether the circuit under test performs according to the appropriate design specifications, the aforementioned responsive electrical activity is detected and measured using an electrical activity detection apparatus. Finally, the characteristics of the circuit under test are determined based on the measured responsive electrical activity in the circuit. The integral components of the inventive diagnostic system will now be described in detail with reference to the attached drawings.

Reference will now be made to FIG. 1, which illustrates an exemplary embodiment of a diagnostic system 100 consistent with the principles of the present invention. The depicted embodiment of the diagnostic system 100 implementing the inventive measurement technique comprises an optical stimulus source 101 for stimulating one or more optical signal receivers 102 disposed on a wafer 103. The aforementioned optical stimulus source 101 is optically coupled with the corresponding signal receiver 102 by means of an optical coupling setup 104. The depicted embodiment of the optical coupling setup 104 may include a scan lens 105, a position adjustment means 106 and an objective lens 107. A beam of stimulating electromagnetic energy produced by the optical stimulus source 101 is designated in the FIG. 1 with numeral 108.

In the embodiment of the invention depicted in FIG. 1, the optical stimulus source 101 is an electromagnetic radiation source. Specifically, it may be a pulsed laser source, such as a modelocked laser or a Q-switched laser. In another embodiment, the stimulus source 101 may be a modulated continuous wave (CW) laser. The aforementioned Q-switched and modulated continuous wave (CW) lasers are well known to persons of skill in the art and are commercially available. Modelocked lasers, which can be externally synchronized, are also well known in the art and are commercially available from several vendors, including Time Bandwidth Products of Zurich, Switzerland and Lightwave Technologies, Inc. of California.

There are several methods for modulating a CW laser. For example, the CW laser light can be passed through an electro-optic modulator, which may comprise a set of crossed polarizers disposed at the input and output of the modulator. Between the aforementioned input and output polarizers, there is an electro-optic crystal which rotates the polarization of the input light by an amount which depends on an electric field applied to the crystal by two electrical plates which are disposed with respect to the crystal in a sandwich-like manner. The optical output of the modulator depends on the orientation of the input and output polarizers as well as the voltage applied to the electro-optic crystal. The described method for modulating a CW laser as well as other such methods are well known to those skilled in the art. The appropriate equipment is available commercially from such vendors as New Focus, Inc. of California. In an embodiment of the inventive diagnostic system, the stimulus source 101 is externally synchronized to a timebase or a clock signal. In this embodiment, an external timebase generator, such as a crystal-based clock generator, may be provided for synchronizing the operation of various components of the system. In an alternative embodiment, the stimulus source 101 may provide the timebase for the rest of the system if it has its own timebase. Thereby, the optical stimulus signal 108 will be driven by a timebase shared by the rest of the diagnostic system 100.

In an embodiment of the invention, the stimulus signal 108 is detected by a photoreceiver 102 disposed on the wafer 103. Exemplary receivers suitable for application in the inventive system are described in detail in Zimmermann and Heide, A Monolithically Integrated 1-Gb/s Optical Receiver in 1 $\mu$m CMOS Technology, IEEE Photonics Technology Letters, Vol. 13, No. 7, pp. 711–713, July 2001 and Zimmermann and Heide, A Monolithic High-Speed CMOS-Photoreceiver, IEEE Photonics Technology Letters, Vol. 11, No. 2, pp. 254–256, February 1999, incorporated herein by reference. Specifically, the photoreceiver 102 may be a CMOS-integrated p-i-n photodiode, which is characterized by high speed and high quantum efficiency. Such receivers may be manufactured by an industrial 1.0 micron CMOS process with a reduced doping concentration in the epitaxial layer. The aforementioned manufacturing process for CMOS-integrated p-i-n photodiode is well known to persons of skill in the art. It will also be understood by those of skill in the art, that the exact design of the receiver 102 is not essential to the present invention.

The receiver 102 may be manufactured using the same fabrication process technology as the one used in the fabrication of the circuit under test. It should be noted that because the wafer may be probed early in the manufacturing process, it is possible to couple the light to the receivers disposed on the front surface of the wafer. Accordingly, the optical stimulus source may operate using the light with wavelength of less than 1 micron, which is strongly absorbed by silicon. Other designs of the optical stimulus source 101 and the optical receiver 102 may be utilized. For example, an optical signal injection scheme utilizing a high-output Pigitailed laser diode source in conjunction with various types of photodiode receivers manufactured using the standard Thesys 1.5 micron n-well process is described in detail in H. H. Berger et al., Contactless Function Test of Integrated Circuits on the Wafer, Proceeding of the 22$^{nd}$ International Symposium for Testing and Failure Analysis, 18–22 November 1996, Los Angeles, Calif., which is incorporated herein by reference. An article by F. Esfahani et al., Small Area Optical Inputs for High Speed CMOS Circuits, 9$^{th}$ Annual IEEE International ASIC Conference and Exhibit, Sep. 23–27, 1996, Rochester, N.Y., incorporated herein by reference, demonstrates another technique for optically injecting a signal into an integrated circuit at a wafer or a package level using CMOS-type on-chip photodiodes sensitive in the visible light region. It should be noted, that one embodiment of the inventive technique may utilize light sources with shorter wavelength (<1 micron), where silicon absorbs more efficiently.

In an embodiment of the invention, the electrical test signal induced in the optical signal receiver 102 by the electromagnetic energy produced by the stimulus source 101 may be amplified, conditioned or buffered before being applied to the circuit under test 109. To this end, the integrated circuit disposed on the aforementioned wafer 103 may include optional signal amplification, buffering and conditioning circuitry (not shown in the FIG. 1). The methods for designing and implementing such circuitry are well known in the art. For example, an embodiment of a suitable signal conditioning circuit is described in the aforementioned article by H. H. Berger et al.

The electrical test signals injected into the circuit under test 109 induce a responsive electrical activity therein. To determine whether the circuit under test performs according to the appropriate design specifications, the need arises to detect and measure any such responsive electrical activity induced within the circuit by the aforementioned test signal. There have been developed numerous advanced techniques for detecting and quantitatively measuring various electrical signals within integrated circuits. Specifically, the responsive electrical activity may be measured by detecting photons emitted by various components of the integrated circuit. Methods for measuring electrical activity in the circuit based on the detected photon emission are well known in the art. Exemplary embodiments of aforementioned methods are described in Khurana, N. and C. L. Chiang, Analysis of Product Hot Electron Problems by Gated Emission Microscopy, in proceedings of International Reliability Physics Symposium (IRPS), 1986 and in U.S. Pat. No. 5,940,545, incorporated herein by reference in their entirety.

In the embodiment depicted in FIG. 1, the electrical activity induced in the circuit under test 109 by the electrical test signal is detected and measured using an electrical activity detection apparatus 110. An exemplary embodiment of the aforementioned electrical activity detection apparatus 110 comprises a hot-electron emission detector 111 for detecting photon emissions emanated by the circuit under test 109. The emission detector 111 of the electrical activity detection apparatus 110 needs to be capable of detecting extremely weak light emissions produced by the integrated circuit 109. For this purpose, the emission detector 111 may first amplify the input light emission signal to the amplitude suitable for detection by conventional means. For this purpose, the input stage of the emission detector 111 may be equipped with an appropriate light signal intensifier. Suitable signal intensifiers may include photon-counting detectors with time resolution, such as a photomultiplier tube (PMT) or an avalanche photon detector (APD) operating in the Geiger mode.

Photon detection techniques utilizing PMT and APD detectors are well known to those skilled in the art. Exemplary embodiments of these light detection devices are described in S. Charbonneau, L. B. Allard, J. F. Young, G. Dyck, B. J. Kyle, Rev. Sci. Instrum. 63, 5315 (1992). These devices are commercially available from numerous suppliers such as Quantar Technology, Inc. of Santa Cruz, Calif. An optical filter designated by numeral 117 in FIG. 1 is provided in order to prevent the optical signal produced by the stimulus source 101 from entering the detector 111. The filter 117 may be an optical interference filter. To facilitate filtering, in one embodiment of the invention, the frequency of the light signal produced by the optical stimulus source 101 is set to be different from the emission spectra of the integrated circuit. The transmission characteristics of the filer 117 may be chosen in such a manner as to enable it to block the light produced by the stimulus source 101, while being substantially transparent to the light emitted by the integrated circuit. For example, the wavelength of the stimulating laser could be 400 nm, which can be produced using a commercially available pulsed diode laser such as one manufactured by Polytec PI. On the other hand, the detected emission wavelength spectrum could be made between 1.0 micron and 1.5 micron using an InGaAs single-photon avalanche detector (SPAD).

Collection lens 108 facilitates the detection of the optical emissions and acquisition of the test structure images, while tube lens 120 controls the illumination of the test structures. A field lens 119 controls the width of the field of view of the detector 111 by generating an intermediate image of the upper surface of the test structure 109 in the plane of the field aperture 116. A system control module 122 controls overall operation of the apparatus by controlling the timing, image acquisition, positioning of the wafer, etc. The power is supplied to the circuit under test by a power supply module 121.

It will be appreciated by those of skill in the art that the emission detector 111 may be imaging as well as non-imaging. Specifically, an imaging emission detector 111 would provide information indicative of the spatial distribution of the intensity of the emitted photon signal across the surface area of the integrated circuit 109. Such imaging system may either have time resolution or collect the total incident photon flux rate over some period of time longer than typical events in the circuit (e.g. longer than 100 ps). An imaging system providing spatial information on the photon emission would allow the simultaneous collection of photons from emitting sources within the entire field of view of the optical system, thus potentially increasing system throughput and providing more comprehensive information on the circuit under test. One example of an imaging emission detector is a position-sensitive photon detector having no timing output, such as a cooled silicon charge-coupled device (CCD) detector or a cooled mercury-cadmium-telluride (MCT) detector. The design and methods of operation of the aforementioned charge-coupled device (CCD) detectors, mercury-cadmium-telluride (MCT) detectors as well as other suitable position-sensitive photon detectors are well known to persons of skill in the art. One example of an integrated circuit imaging system using a charge-coupled device (CCD) detector is described in detail in U.S. Pat. No. 5,940,545, incorporated herein by reference in its entirety.

On the other hand, a non-imaging emission detector 111 would provide information on the intensity and, possibly, the timing distribution of the emission signal, but not its spatial distribution. One example of a non-imaging emission detector is a non-position-sensitive photon detector, such as a photodiode or a photomultiplier tube.

In an embodiment of the inventive diagnostic technique, the emission detector 111 may be arranged to operate in a time-resolved manner. The term time-resolved emission detector, used herein, refers to an emission detector acquiring, among other information, the data on the timing characteristics of the detected signal. The aforementioned timing characteristics of the emission signal may include the time distribution of the intensity of the signal, or combined time and spatial distribution thereof.

One exemplary embodiment of the time-resolved emission detector is a gated emission detector, such as a micro-channel plate (MCP) photomultiplier tube. Specifically, the gated emission detector is designed to collect the input emission signal only during a predetermined time interval, defined by a gate signal. The gating may be implemented, for example, by using the gate signal to control the high voltage power of the aforementioned microchannel plate (MCP) photomultiplier. The gate signal, which is supplied to the detector by an external logic, is positioned in time in a pre-determined relation with respect to the input test signal. By changing the relative time delay between the gate signal and the test signal, one could study the timing characteristics of the integrated circuit response to the input test signal. Accordingly, by varying the time delay between the pulse of the light source 101 and the gate signal supplied to the detector 111, the inventive diagnostic system may acquire information on the timing characteristics of the circuit under test.

Exemplary embodiments of the aforementioned non-imaging time-resolved detector include, but are not limited to, Indium-Gallium-Arsenide (InGaAs), Germanium (Ge) or Silicon (Si) single photon avalanche detectors (SPAD). Alternatively, a superconducting hot-electron bolometer could be also utilized for this purpose. The absorption of a photon by the non-imaging time-resolved emission detector produces a measurable voltage pulse which can be used to either start or stop the timing circuit. To this end, the stimulus optical source 101, providing the test signal, and the time-resolved emission detector 111, measuring the circuit's response to the test signal, may be synchronized using the same timebase.

An example of an imaging, time-resolved detector is an image intensifier (available from several vendors such as Hamamatsu Photonics of Hamamatsu, Japan) or photomultiplier tube with a resistive anode position readout (available from several vendors including Quantar Technologies of Santa Cruz, Calif. and Photek Ltd. of East Sussex, UK). Such imaging, time-resolved detectors provide both the time and the position of the detected photon, thus allowing simultaneous analysis of a region of the circuit under test (CUT).

The design and methods of operation of time-resolved photon detectors are well known to persons of skill in the art.

In another embodiment of the inventive diagnostic system, the emission detector 111 is a non-time resolved emission detector, such as the aforementioned cooled silicon charged-coupled device (CCD) and mercury-cadmium-telluride (MCT) detector arrays. The photon-sensitive detector without timing resolution may be used to perform either spatial emission measurement or the total photon emission measurements.

The detection and measurement of the responsive electrical activity in the integrated circuit may also be implemented using a laser-based waveform sampling system. An example of such system is described in U.S. Pat. No. 5,905,577, which is incorporated herein by reference. Specifically, the waveform of the electric signal in the circuit may be studied by focusing a laser beam onto the device under test (DUT) and detecting the reflected beam. The reflected beam carries information about the electrical signals in the DUT. This information may be encoded in the form of reflected beam amplitude, phase and/or polarization modulations. By analyzing the electrically induced modulated properties of the reflected laser beam, the system may determine the characteristics of the electric signals in the test circuit. To increase the signal-to-noise ratio of such a laser probing system, it is desirable to provide an additional reference laser beam and use the ratio of the amplitudes of the aforementioned two beams for the wave form analysis. Another example of a laser probing system is described in detail in U.S. Pat. No. 5,872,360, which is incorporated herein by reference. In the described system, a laser beam having a wavelength near the band gap of a semiconductor, such as silicon, is focused on a P-N junction. The application of the external electric field to the illuminated junction changes the degree of photo-absorption of the impinging laser light due to the phenomenon of electro-absorption. The disclosed system measures the characteristics of the laser light passing through the junction to reconstruct the properties of the electrical signal at the junction. It should be noted, that many other designs of laser sampling systems, well known to persons of skill in the art, may be utilized to analyze the responsive electrical activity within the circuit.

Additional designs of suitable laser-based probing systems are described in Hemenway, Heinrich et al., Optical Detection of Charge Modulation in Silicon Integrated Circuits Using a Multimode Laser-Diode Probe, IEEE Electron Device Letters, Vol. EDL-8, No. 8, August 1987; Heinrich, Pakdaman et al., Backside Optical Measurements of Picosecond Internal Gate Delays in a Flip-Chip Packaged Silicon VLSI Circuit, IEEE Photonics Technology Letters, Vol. 3, No. 7, July 1991; Heinrich, Pakdaman et al., Picosecond Backside Optical Detection of Internal Signals in Flip-Chip Mounted Silicon VLSI Circuits, Microelectronic Engineering, Vol 16, pp. 313–324, Elsevier 1992; and U.S. Pat. Nos. 4,758,092, 5,905,577, and 5,872,360. All the listed disclosures and patent documents are incorporated herein by reference in their entirety. It should be also noted that under some conditions the laser probing may not be suitable for small capacitance devices (such as ones fabricated using less than 0.13 micron technology) or silicon-on-insulator type devices because it can produce excessive leakage current if the laser is tuned near the band gap.

In another embodiment of the inventive technique, the electrical activity detection apparatus may be based on an electron beam probe. Specifically, the predetermined regions of the circuit under test may be illuminated using a beam of primary electrons. An electron detector may be provided in the vicinity of the wafer to register and measure any secondary emissions originating from the tested circuit. This emission information may be used to determine the responsive electrical activity within the circuit. In more detail, the emission of secondary electrons by a metal line exposed to the electron beam depends on the voltage applied to that line. Hence, the voltage on the line can be deterministically related to the secondary electron emission. By registering the secondary electron emission in a time resolved manner, the voltage on the line as a function of time can be partially reconstructed. Electron-beam probing technology is well-known to those skilled in the art and is described in L. C. Wagner, Ed., *Failure Analysis of Integrated Circuits: Tools and Techniques* (Kluwer Academic Publishers, 1999). However, because such a system may require sustaining of an ambient vacuum, it may be less suitable for application in some manufacturing processes.

It will be appreciated by those of skill in the art that the described embodiments of the electrical activity detection apparatus operate in electrically non-loading (or minimally-loading) and mechanically contactless manner. Specifically, the aforementioned means for detecting electrical activity in the integrated circuit based on the photon emission as well as the laser and electron-beam probing do not require a mechanical or capacitive coupling of the probe to the integrated circuit. Accordingly, the described methods of coupling of the electrical activity detection apparatus would not substantially alter the electrical loads or impedances within the circuit under test. Such mechanically contactless coupling and signal detection techniques that cause minimal or no electrical loading of the circuit will be referred to herein as electrically non-loading coupling and electrically non-loading signal detection.

Alternatively, the electrical activity in the circuit under test may be detected by means of a mechanical probe, mechanically engaging a conducting pad or a contact disposed on the surface of the integrated circuit in such a manner as to establish an electrical connection therewith. Such mechanical probe would be electrically connected to the input of an appropriate signal analysis circuit. As will be readily understood by those of skill in the art, such coupling may alter the circuit's impedance at the point of application of the mechanical probe.

In yet another embodiment, an electro-optic crystal can be disposed in the spatial proximity of a metal line on the wafer on which the voltage is to be measured. The application of a voltage to the metal line would cause the change of the electric field in the crystal. The aforementioned change in the electric field would, in turn, change the optical properties of the crystal. The optical properties of the crystal, indicative of the voltage on the metal line, can be probed by a suitable laser beam directed thereupon using a suitable optical system. This technique is described in detail in U.S. Pat. No. 4,681,449, which is incorporated herein by reference.

Finally, the electrical activity may be detected using a capacitive coupling of the probe and the test circuit. In more detail, a flat conductive probe may be arranged in a spatial proximity of a pad or a contact on the surface of the integrated circuit such as to provide for a capacitive coupling between the two without achieving a mechanical engagement thereof. To this effect, the flat surface of the probe may be aligned in substantially parallel manner with respect to the surface of the integrated circuit. As the mechanical probing method, this coupling technique may cause a change of the impedances and/or electrical loads in the integrated circuit, and, therefore, may have an affect on the circuit performance.

To aid in locating the appropriate test structure 109 on the wafer 103 during navigation, the surface of the wafer 103 may be illuminated using an illumination light source 112. The illuminating light generated by the light source 112 is directed towards the wafer 103 by mirror 118. For example, the illumination light source 112 may be implemented using a fiber-optic technology. In an embodiment of the inventive diagnostic system shown in FIG. 1, the image of the test structure 109, which is created in the aforementioned illuminating light reflected by the surface of the wafer 103, is registered by an array camera 113. To facilitate the acquisition of the image, the camera 113 is provided with a beam splitter 114 and a tube lens 115. The elements 118 and 114 may be removed away from axis of the optical system during the detection of the electrical activity in the circuit and re-inserted during the navigation. The image of the wafer created by camera 113 may be further processed using a variety of known image analysis or pattern recognition techniques, to locate the appropriate circuit on the wafer.

The injected test signal can either be directly coupled to the circuit under test (CUT), or it can be amplified, conditioned or buffered to increase the signal amplitude and edge sharpness. The test signal can be injected at one or more locations of the circuit using an appropriate optical beam-splitter and lens configuration. Alternately, more than one optical stimulus source can be used. The circuit under test can be either inter-die or intra-die. Inter-die circuits are typically spaced throughout the wafer. They can be used to monitor process and performance variations across the wafer. Intra-die circuits could be used to monitor variations of process and performance parameters within a die. Such variations may include, but are not limited to, variations in threshold voltage, leakage current, as well as variations in dynamic circuit behavior such as signal rise time.

The electrical test signals injected into the circuit under test induce a responsive electrical activity therein. To determine whether the circuit under test performs according to the appropriate design specifications, the need arises to detect and measure any such responsive electrical activity induced within the circuit by the aforementioned test signal. There have been developed numerous advanced techniques for detecting and quantitatively measuring various electrical signals within integrated circuits. Specifically, the responsive electrical activity may be measured by detecting photons emitted by various components of the integrated circuit under test.

Under normal operating conditions, a variety or sources within the integrated circuit may emit photons. The photon emission mechanisms include, but are not limited to: (1) emissions form gate oxide leakage between transistor gate and either the substrate or the diffusion area; (2) emissions from forward biased pn junctions; (3) emissions from MOS transistors in the state of saturation during normal switching operation; (4) emissions from MOS transistors in the state of saturation caused by an open circuit; (5) emissions from tunneling in a reverse-biased junction; and (6) emissions from electron-hole recombination.

By isolating and detecting emissions from specific localized sources within the integrated circuit, it may be possible to make conclusions about the behavior of the integrated circuit in response to the injected test signal. For example, an article by P. Bellutti et al., Fowler Nordheim Induced Light Emission From MOS Diodes, in proceedings of IEEE International Conference on Microelectron Test Structures, Monterey, Calif., Mar. 13–16, 2000, incorporated herein by reference, describes a method for investigating integrated circuit behavior based on a photon emission from a gate leakage current, specifically the Fowler-Nordheim tunneling from the gate polysilicon through the oxide layer into the silicon. An embodiment of the present invention detects such emission using the time-resolved photon counting detector, described in detail above. Based on the detected photon emission, the value of the leakage current in the gate is calculated. In addition, the inventive diagnostic system may measure the dynamic emissions of MOSFET structures to study the timing, drain and substrate currents as well as other characteristics of integrated circuits, substantially as described in T. Ohzone, M. Yuzaki, T. Matsuda, et al., A Study on Hot-Carrier-Induced Photoemission in n-MOSFETs Under Dynamic Operation, in proceedings of IEEE International Conference on Microelectron Test Structures, Monterey, Calif., Mar. 13–16, 2000, p. 75, incorporated herein by reference.

The regions of the circuit under test can be isolated either by using an imaging detector, or by providing an aperture 116 in the optical detection system 110 to block emission from other sites. The timing of the photon emission is detected by the emission detector 111 relative to the timing of the signal produced by the optical stimulus source 101, which is injected into the circuit. For this purpose, the system may include a time-to-amplitude converter (TAC) or other similar precision timing device. The photon emission data can be analyzed in a number of ways, including, but not limited to, one or more of the following: (1) edge-to-edge timing of transition events; (2) total photon emission; (3) photon emission in peaks; (3) shape of CUT emission compared to known good or simulated CUT emission; (5) spectral properties of the emission to look for sources of photon emission (which may require additional time for spectral measurements); and (6) strength of emission modulation, in the case wherein the stimulus source is used for device bias modulation. An exemplary embodiment of an integrated circuit testing system using a time-resolved emission detector is described in detail in the aforementioned U.S. Pat. No. 5,940,545.

FIG. 2 illustrates a layout diagram of an exemplary embodiment of a process monitoring system 200 utilizing the inventive diagnostic technique. Such a system may be installed within a fabrication line of integrated circuits. In that figure, wafer 204 is delivered for diagnostics by a wafer handling means 210. The wafer handler 210 automatically loads the wafer 204 onto an XYZ stage 202 and 203, controlled by a stage controller 207. The XYZ stage 202 and 203, mounted on a frame 201, effectuates the positioning of the wafer 204 in a predetermined orientation relative to the probe card 205. The stage may be also used to displace the wafer such as to facilitate the probing of different sites on the wafer 204. The probe card 205 comprising optical coupling members (not shown) may direct an illuminating light onto the wafer 204. In addition, the probe card 205 may direct a stimulating light signal onto predetermined regions of the circuit under test. The stimulating light signal may be produced by a pulsed light source, such as a laser system 209. The probe card 205 may also collect the photon emissions produced by the circuit under test. DC power is supplied to the circuit using conventional mechanical probe tips 211. In the described embodiment, the wafer 204 may be placed on a temperature-controlled surface (not shown), in order to perform temperature-dependent studies. The overall operation of the diagnostic system is controlled by system electronics 208.

FIG. 3 depicts an exemplary embodiment of the test signal injection and detection methodology consistent with principles of the present invention. Power and ground are provided by conventional probe pins 301 and 302 to pads 303 and 304, respectively. The pads 303 and 304 may comprise a part of metal layer M1, metal layer M2 or higher metal layers of the integrated circuit. The electrical test signal is injected into the circuit by means of a beam of stimulating radiation 305, generated by a pulsed laser source 319 and impinging on a photoreceiver 306 disposed on the wafer 307. To this end, the pulsed laser source 319 may have an optical access to the receiver 306. The electrical test signal may be buffered using buffer circuitry 308–311 and sent into the circuit under test 312. Photon emission signals 313 and 314 from the circuit 312 are detected by a time-resolved photon detector 315 and produce time-resolved photon emission signals (intrinsic emission) therein. Special structures 316–318 optimized for photon emission may be used to speed up signal acquisition time. In an embodiment of the invention, the aforementioned special structures 316–318 may comprise a large logical inverter or a transistor operating in a substantially high (higher than Vdd) biasing voltage mode. The special structures 316–318 produce an enhanced photon emission 319, which is also detected by the time-resolved detector 315 disposed within the optical input-output module 320.

FIGS. 4 and 5 depict an exemplary embodiment of an inventive hybrid opto-electrical probe card 401. The shown embodiment of the probe card was designed to provide both power and test signals to the circuit under test. To this end, the probe card 401 comprises standard mechanical contact tips 402 and 403 for mechanically engaging contact areas within the circuit under test and supplying DC voltages thereto. The probes 402 and 403 are connected to an appropriate power supply voltage source using conducting wires 404 and 405, respectively. The probe card 410 may also contain optical access members, such as 406, 407, 505 and 506 for establishing optical contact with an integrated circuit disposed on a wafer 501. The optical signals are transferred to and from the probe card by means of optical fibers 502, 503 and 504. The optical members 406 and 407 comprise means (not shown) for securing the ends of the aforementioned optical fibers 502, 503 and 504 as well as focusing lenses 505 and 506, placed at a suitable distance from the fiber end so that the light coupled through the focusing lens is concentrated onto the receiver on the wafer. The depicted embodiment of the inventive probe card is designed to avoid having the probe tips 402 and 403 obstruct the optical access members 406, 407, 505 and 506. In an alternative embodiment, the power and relative ground may be provided to the circuit under test by a continuous wave (CW) laser optically coupled to photo receivers on the wafer.

FIGS. 6 and 7 depict another exemplary embodiment of an inventive hybrid opto-electrical probe card 601 having an open optical access 602. In the shown embodiment, the focusing lens 702 is mounted above the probe card 601. The beam of light 703 delivered to the probe card by the optical fiber 704 is focused onto the surface of the wafer 501 by the focusing lens 702. This light passes through the optical access opening 602 of the probe card 601. It should be noted, that in this embodiment, the probe card 601 may move relative to the focusing lens and fiber assembly 702 and 704.

FIG. 8 depicts a schematic diagram of an exemplary embodiment of an inventive diagnostic measurement acquisition circuitry 800. In order to generate a series of test pulses with an arbitrary duty cycle, two modelocked lasers 801 and 802 could be used, one to define the rising edge (801), the other to define the falling edge of the pulse (802), in the manner shown in the figure. Alternately, a single modelocked laser could be used to create a pulse of fixed width, or the modelocked laser pulse could be split and a delay added to the second laser beam. In the system shown in FIG. 8, the optical signals generated by lasers 801 and 802 may be modulated using EO modulator switches 809 and 810. The laser pulses 811 and 812 are detected by optical receivers 813 and 814 disposed on a wafer 822. The resulting electrical signals are conditioned using buffers 815 and 816. The two output logic pulses are combined in an "AND" gate 803 to create a pulse which is input into the circuit under test 804. A gate generator 805 operating at the test signal frequency generates gate pulses for the EO modulators 809 and 810. It also provides timing signal to the trigger generator 806 for the InGaAs single photon avalanche detector (SPAD) 807, and the stop pulse for the time-to-amplitude converter (TAC) 808. The timebase of the lasers 801 and 802 and the timebase of the detector trigger generator 806 are locked together, as shown in the figure. The gates 817–819 of the test circuit emit photon signals, which are detected by the single photon avalanche detector (SPAD) 807. Special structures 820 and 821 optimized for photon emission may be provided to speed up the signal acquisition time. The time-to amplitude converter 808 provides information on the timing characteristics of the circuit under test 804.

The inventive measurement technique may be used within the production line of integrated circuit devices. Wafers may be automatically loaded into the described diagnostic system. Before testing, the diagnostic system may provide power and ground connection for the circuit under test through the standard electrical probe pins, as described above.

To effectuate the measurement of its parameters, the circuit under test must first be located on the surface of the wafer and the wafer must be displaced in such a manner as to place the circuit in a predetermined position with respect to the opto-electrical probe card. Specifically, the receiving and emitting regions of the circuit under test must be aligned with the corresponding areas of the probe card. The exact location of the circuit on the wafer may be determined using a number of suitable techniques, well known to those skilled in the art. One such method for locating a circuit on a wafer is an optical pattern recognition technique. To align the circuit under test with the probe card, the wafer may be positioned on a movable XYZ stage, which can be computer-controlled.

Once the circuit is located on the wafer and properly aligned in a predetermined manner with respect to the probe card such as to establish any required optical and/or mechanical connections, the optical stimulus system injects a modulated testing signal into the circuit under test. This signal causes a responsive electrical activity within the circuit. Photons emitted during the operation of the circuit under test are registered by the electrical activity detection apparatus. The characteristics of the circuit under test are determined based on the detected photon signal, which is indicative of the responsive electrical activity within the circuit.

The described measurements may be conducted under a variety of conditions. Specifically, the aforementioned diagnostics of the integrated circuit may be performed at different circuit temperatures as well as using different stimulus frequencies, duty cycles, patterns, or voltage amplitudes. In addition, the described diagnostic technique may be utilized to study the dependence of the performance characteristics of the integrated circuit on the voltage of the supplying power source.

It will be appreciated by persons of skill in the art that the inventive diagnostic techniques described herein may be successfully utilized in modern integrated circuit debug applications, which may include, but are not limited to: (1) studies of gate delay and speed performance; (2) measurements of device power consumption; (3) studies of conductor crosstalk and wiring capacitance; (4) measurements of leakage currents; (5) measurements of OFF currents; (6) verification of gate oxide integrity; and (7) testing and measuring of characteristics of resistive interconnects and vias.

The inventive testing concept may also find other important applications, for example, in so called silicon debug procedure, wherein measurements are performed on a wafer in a production environment to ensure that the software modeling of the integrated circuit is accurate. In addition, the inventive technique may find applications in a fabrication process monitoring and automatic process control (APC) to ensure that the process will achieve the intended circuit performance parameters such as speed and power consumption.

It will be apparent to those skilled in the art that various modifications, substitutions and variations can be made in the systems and methods of the present invention as well as in the engineering implementation of this invention without departing from the scope or spirit of the invention.

As mentioned above, the exact nature of the electrical activity detection technique is not critical to the present invention. Specifically, the photons emitted by the circuit under test may be detected using a photon-counting, time-resolved detector. Alternately, the photons may be detected in a non-time-resolved detector such as a cooled silicon charge-coupled device (CCD) detector or a liquid nitrogen cooled mercury-cadmium-telluride (MCT) detector. The aforementioned charge-coupled device (CCD) detector as well as the mercury-cadmium-telluride (MCT) detector are well known to persons of skill in the art and are commercially available.

In another embodiment, the electrical activity in the integrated circuit may be measured using a laser probe, a mechanical probe, or an electron-beam probe, as described in detail above. The photon signal, static emission signal, or laser probe signal is analyzed to provide information on the performance of the device.

Although not shown in the figures, in another implementation, the optical stimulus signal can be combined with DC parametric testing. The DC parametric testing technique is well known in the art. The implementation of such a combined measurement system may include all or some of the components described above, plus additional probe tips and measurement equipment for performing DC parametric measurements. In another embodiment, the optically injected signal can be used to perform high-speed small-signal modulation in circuits with or without various combinations of DC bias.

It should be also noted that any special structures that may be used in the integrated circuit testing process may be disposed in the areas of the wafer that would be severed from the tested integrated circuit in a subsequent sawing or dicing operation. Specifically, the aforementioned contacts, pads, buffers, amplifiers, as well as the light emitting and light receiving structures may be located, for example, in the inter-dye parts of the wafer that would be eliminated at the sawing stage of the integrated circuit fabrication process.

Finally, it will become apparent to those of skill in the art, that the inventive diagnostic technique may be used to test integrated circuits at various stages of the fabrication process. Specifically, partially processed semiconductor wafers may be diagnostically tested according to the principles described herein after being subjected to any appropriate step of the integrated circuit production cycle. Moreover, the testing of the functionally complete integrated circuit may be performed before and even after the packaging.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention.

Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for measuring electrical characteristics of an integrated circuit, said integrated circuit comprising predetermined patterns of active electronic elements disposed on a surface of a semiconductor wafer, said apparatus comprising:
   a stimulating energy source for injecting a test signal into said integrated circuit by stimulating predetermined areas of said integrated circuit;
   a power source for supplying power to at least one of said active electronic elements of said integrated circuit; and
   a detector for detecting an electrical activity within said integrated circuit in response to said injected test signal, wherein said responsive electrical activity comprises switching of at least one of said active electronic elements of said integrated circuit and wherein said characteristics of said integrated circuit are determined based on said detected electrical activity.

2. The apparatus of claim 1, wherein said detector operates to detect said electrical activity in said integrated circuit in an electrically non-loading manner.

3. The apparatus of claim 1, wherein said stimulating energy source operates to inject said test signal without establishing a mechanical contact with said predetermined stimulated areas of said integrated circuit.

4. The apparatus of claim 1, wherein said stimulating energy source stimulates said predetermined areas of said integrated circuit by directing a beam of electromagnetic radiation onto said predetermined areas.

5. The apparatus of claim 1, wherein said predetermined areas of said integrated circuit are stimulated using a beam of charged particles emitted by said stimulating energy source.

6. The apparatus of claim 1, wherein said test signal injected into said circuit is conditioned using a signal conditioning device disposed within said integrated circuit.

7. The apparatus of claim 1, wherein before said injecting, said integrated circuit is located on a wafer and positioned in a predetermined manner with respect to said stimulating energy source and said detector.

8. The apparatus of claim 7, wherein said integrated circuit is located on said wafer using an image of said wafer and performing an optical pattern recognition analysis of said image.

9. The apparatus of claim 7, wherein said integrated circuit is positioned with respect to said stimulating energy source and said detector using a mechanical stage.

10. The apparatus of claim 1, wherein before said injecting, an electrical power is supplied to said integrated circuit.

11. The apparatus of claim 10, wherein said electrical power is supplied to said integrated circuit by disposing a photoreceiver within said circuit and irradiating said photoreceiver using an energy beam.

12. The apparatus of claim 10, wherein said electrical power is supplied to said integrated circuit using at least one mechanical probe engaging at least one conducting pad disposed within said integrated circuit.

13. The apparatus of claim 1, wherein said injecting is performed after deposition of a metal layer of said integrated circuit.

14. The apparatus of claim 1, further comprising a setup for performing parametric measurements on said integrated circuit, wherein results of said parametric measurements are used in determining characteristics of said integrated circuit.

15. The apparatus of claim 1, wherein said detecting of electrical activity within said integrated circuit is performed using a non-time-resolved detection of photons emitted by said integrated circuit.

16. The apparatus of claim 1, wherein said detecting of electrical activity within said integrated circuit is performed using a time-resolved detection of photons emitted by said integrated circuit.

17. The apparatus of claim 1, wherein said detecting of electrical activity within said integrated circuit is performed using a laser beam probing of said integrated circuit.

18. The apparatus of claim 1, wherein said detecting of electrical activity within said integrated circuit is performed using at least one mechanical probe engaging at least one conducting pad disposed within said integrated circuit.

19. The apparatus of claim 1, wherein said detecting of electrical activity within said integrated circuit is performed using an electron-beam probing of said integrated circuit.

20. An apparatus for measuring electrical characteristics of an integrated circuit, said integrated circuit comprising predetermined patterns of active electronic elements disposed on a surface of a semiconductor wafer, said apparatus comprising:

a stimulating energy source for injecting a test signal into said integrated circuit by stimulating predetermined areas of said integrated circuit;

a power source for supplying power to at least one of said active electronic elements of said integrated circuit;

a detector for detecting an electrical activity within said integrated circuit in response to said injected test signal, wherein said responsive electrical activity comprises switching of at least one of said active electronic elements of said integrated circuit; and a processing unit for determining said characteristics of said integrated circuit based on said detected electrical activity.

21. The apparatus of claim 20, further comprising a system control unit for controlling the operation of said measuring apparatus.

22. The apparatus of claim 21, wherein said system control unit comprises a timebase generator for generating a timebase signal for synchronizing operation of said stimulating energy source and said detector.

23. The apparatus of claim 20, wherein said stimulating energy source provides a timebase signal for synchronizing operation of said measuring apparatus.

24. The apparatus of claim 20, further comprising an optical coupling setup for optically coupling said stimulating energy source to said predetermined areas of said integrated circuit.

25. The apparatus of claim 24, wherein said optical coupling setup comprises a scan lens.

26. The apparatus of claim 24, wherein said optical coupling setup comprises an objective lens.

27. The apparatus of claim 24, wherein said optical coupling setup comprises a position adjustment means.

28. The apparatus of claim 20, wherein said stimulating energy source comprises an electromagnetic energy source arranged to direct a beam of electromagnetic radiation onto said predetermined areas of said integrated circuit.

29. The apparatus of claim 28, wherein said electromagnetic energy source is a light source.

30. The apparatus of claim 28, wherein said electromagnetic energy source is a laser.

31. The apparatus of claim 28, wherein said electromagnetic energy source is a pulsed light source.

32. The apparatus of claim 28, wherein said electromagnetic energy source is selected from the group consisting of a Q-switched laser, a modelocked laser and a modulated continuous wave laser.

33. The apparatus of claim 20, wherein said stimulating energy source comprises a particle source arranged to direct a beam of charged particles onto said predetermined areas of said integrated circuit.

34. The apparatus of claim 33, wherein said particle source is an electron beam source.

35. The apparatus of claim 20, further comprising navigation means for locating said integrated circuit on a wafer.

36. The apparatus of claim 20, wherein said detector is a time-resolved photon detector.

37. The apparatus of claim 36, wherein said time-resolved photon detector is selected from the group consisting of an Indium-Gallium-Arsenide (InGaAs) detector, a Germanium (Ge) detector, a Silicon (Si) detector, an image intensifier, a photomultiplier tube and a superconducting hot-electron bolometer.

38. The apparatus of claim 20, wherein said detector is a hot-electron emission detector.

39. The apparatus of claim 20, wherein said detector comprises a light signal intensifier for amplifying photon emissions from said integrated circuit.

40. The apparatus of claim 20, wherein said detector comprises a non-time-resolved photon detector.

41. The apparatus of claim 20, wherein said detector comprises a non-imaging photon detector.

42. The apparatus of claim 20, wherein said detector comprises a photodiode.

43. The apparatus of claim 20, wherein said detector comprises a photomutiplier tube.

44. The apparatus of claim 20, wherein said detector comprises an imaging photon detector.

45. The apparatus of claim 20, wherein said detector comprises a charge-coupled device (CCD) detector.

46. The apparatus of claim 45, further comprising means for cooling said charge-coupled device (CCD) detector.

47. The apparatus of claim 20, wherein said detector is a mercury-cadmium-telluride (MCT) detector.

48. The apparatus of claim 47, further comprising means for cooling said mercury-cadmium-telluride (MCT) detector.

49. The apparatus of claim 20, wherein said detector comprises a laser-based waveform probing system.

50. The apparatus of claim 20, wherein said detector comprises an electron beam probe.

51. The apparatus of claim 20, wherein said detector comprises an electro-optic crystal and a laser probing system for probing optical properties of said electro-optic crystal, wherein said probed optical properties are indicative of electrical potential in the proximity of said electro-optic crystal.

52. The apparatus of claim 20, wherein said detector is capacitively coupled to said integrated circuit.

53. The apparatus of claim 20, further comprising a movable stage for positioning of said integrated circuit in a predetermined orientation relative to said stimulating energy source.

54. The apparatus of claim 20, further comprising a movable stage for positioning of said integrated circuit in a predetermined orientation relative to said detector.

55. The apparatus of claim 20, wherein a position of said movable stage is controlled by said system control unit.

56. The apparatus of claim 55, further comprising wafer image acquisition means, wherein the position of said movable stage is controlled by said system control unit based on an image of said semiconductor wafer acquired by said wafer image acquisition means.

57. The apparatus of claim 20, further comprising a probe card comprising an optical coupling assembly for optically coupling said integrated circuit to said stimulating energy source.

58. The apparatus of claim 57, wherein said optical coupling assembly comprises a focusing lens.

59. The apparatus of claim 57, wherein said optical coupling assembly comprises an optical fiber.

60. The apparatus of claim 57, wherein said probe card further comprises means for applying electrical power from said power source to said at least one of said active electronic elements of said integrated circuit.

61. The apparatus of claim 20, further comprising a probe card comprising an optical coupling assembly for optically coupling said integrated circuit to said detector.

62. An apparatus for measuring electrical characteristics of an integrated circuit, said integrated circuit comprising predetermined patterns of active electronic elements disposed on a surface of a semiconductor wafer, said apparatus comprising:

means for injecting a test signal into said integrated circuit by stimulating predetermined areas of said integrated circuit;

means for supplying power to at least one of said active electronic elements of said integrated circuit;

means detecting an electrical activity within said integrated circuit in response to said injected test signal, wherein said responsive electrical activity comprises switching of at least one of said active electronic elements of said integrated circuit; and means for determining said characteristics of said integrated circuit based on said detected electrical activity.

* * * * *